(12) United States Patent
Hopkins et al.

(10) Patent No.: US 11,393,835 B2
(45) Date of Patent: Jul. 19, 2022

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 238 days.

(21) Appl. No.: 16/894,519

(22) Filed: Jun. 5, 2020

(65) Prior Publication Data
US 2021/0384208 A1 Dec. 9, 2021

(51) Int. Cl.
*H01L 27/11582* (2017.01)
*H01L 27/11556* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC ................. H01L 27/11582; H01L 27/11578
See application file for complete search history.

(56) References Cited

U.S. PATENT DOCUMENTS 9,431,419 B2   8/2016  Fukuzumi et al.
9,741,737 B1   8/2017  Huang et al.
(Continued)

FOREIGN PATENT DOCUMENTS

| CN | 102760738 | 10/2012 |
|---|---|---|
| CN | 108807405 | 11/2018 |
| KR | 10-2016-0018921 | 2/2016 |
| KR | 10-2016-0094186 | 8/2016 |
| KR | 10-2017-0093099 | 8/2017 |
| KR | 10-2018-0045975 | 5/2018 |
| TW | 201901933 | 1/2019 |
| WO | WO 2016/093947 | 6/2016 |

OTHER PUBLICATIONS

Shie, "The Interface Investigation of High-K Material Al2O3 on Si Substrate", A Thesis Submitted to the Institute of Electronics, College of Electrical Engineering and Computer Science, National Chiao Tung University, 2004, Taiwan, 63 pgs.
(Continued)

*Primary Examiner* — Christopher A Johnson
(74) *Attorney, Agent, or Firm* — Wells St. John P.S.

(57) ABSTRACT

A method used in forming a memory array comprising strings of memory cells comprises forming a conductor tier comprising conductor material on a substrate. A stack comprising vertically-alternating first tiers and second tiers is formed above the conductor tier. The stack comprises laterally-spaced memory-block regions. Channel-material strings extend through the first tiers and the second tiers. Material of the first tiers is of different composition from material of the second tiers. Spaced insulator-material bodies are formed in and longitudinally-along opposing sides of individual of the memory-block regions in a lowest of the first tiers. After forming the spaced insulator-material bodies, conductive material is formed in the lowest first tier that directly electrically couples together the channel material of individual of the channel-material strings and the conductor material of the conductor tier. Other embodiments, including structure independent of method, are disclosed.

31 Claims, 20 Drawing Sheets

FIG. 38

(51) Int. Cl.
  *H01L 27/11519* (2017.01)
  *H01L 27/11565* (2017.01)
  *H01L 27/1157* (2017.01)
  *H01L 27/11524* (2017.01)
(52) U.S. Cl.
  CPC .. *H01L 27/11524* (2013.01); *H01L 27/11565* (2013.01); *H01L 27/11582* (2013.01)

(56) References Cited

U.S. PATENT DOCUMENTS

| | | | |
|---|---|---|---|
| 9,978,772 | B1 | 5/2018 | Carlson |
| 10,236,301 | B1 | 3/2019 | Howder et al. |
| 10,566,241 | B1 | 2/2020 | Chandolu et al. |
| 10,903,237 | B1* | 1/2021 | Hosoda ............. H01L 27/11519 |
| 2009/0166710 | A1 | 7/2009 | Shimizu et al. |
| 2010/0109072 | A1 | 5/2010 | Kidoh et al. |
| 2011/0147824 | A1 | 6/2011 | Son et al. |
| 2011/0298013 | A1 | 12/2011 | Hwang et al. |
| 2011/0303971 | A1 | 12/2011 | Lee et al. |
| 2012/0156848 | A1 | 6/2012 | Yang et al. |
| 2012/0273865 | A1 | 11/2012 | Lee et al. |
| 2015/0017770 | A1 | 1/2015 | Lee et al. |
| 2015/0318301 | A1 | 11/2015 | Lee et al. |
| 2016/0043100 | A1 | 2/2016 | Lee et al. |
| 2016/0111435 | A1 | 4/2016 | Pang et al. |
| 2016/0163389 | A1 | 6/2016 | Zhang et al. |
| 2016/0163729 | A1 | 6/2016 | Zhang et al. |
| 2016/0172370 | A1 | 6/2016 | Makala et al. |
| 2016/0204117 | A1 | 7/2016 | Liu et al. |
| 2016/0225754 | A1 | 8/2016 | Jang |
| 2016/0233230 | A1 | 8/2016 | Furuhashi et al. |
| 2016/0268302 | A1 | 9/2016 | Lee et al. |
| 2017/0054036 | A1 | 2/2017 | Dorhout et al. |
| 2017/0236896 | A1 | 8/2017 | Lu et al. |
| 2017/0243650 | A1 | 8/2017 | Ogawa et al. |
| 2017/0278859 | A1 | 9/2017 | Sharangpani et al. |
| 2017/0309339 | A1 | 10/2017 | Hsiung et al. |
| 2018/0114794 | A1 | 4/2018 | Jang et al. |
| 2018/0122906 | A1* | 5/2018 | Yu ..................... H01L 27/11529 |
| 2018/0204849 | A1 | 7/2018 | Carlson et al. |
| 2018/0254285 | A1 | 9/2018 | Lee et al. |
| 2018/0294273 | A1 | 10/2018 | Liao et al. |
| 2018/0323213 | A1 | 11/2018 | Arai |
| 2019/0096905 | A1 | 3/2019 | Park et al. |
| 2020/0168624 | A1 | 5/2020 | Howder et al. |
| 2020/0279855 | A1 | 9/2020 | Tran et al. |

OTHER PUBLICATIONS

U.S. Appl. No. 15/930,222, filed May 12, 2020, by Hopkins.
U.S. Appl. No. 15/930,724, filed May 13, 2020, by Hopkins.
U.S. Appl. No. 15/930,836, filed May 13, 2020, by Hopkins et al.
U.S. Appl. No. 15/931,116, filed May 13, 2020, by Hopkins et al.
U.S. Appl. No. 15/931,299, filed May 13, 2020, by Hopkins et al.
U.S. Appl. No. 16/194,946, filed Nov. 19, 2018, by Clampitt et al.
U.S. Appl. No. 16/251,241, filed Jan. 18, 2019, by Howder et al.
U.S. Appl. No. 16/277,311, filed Feb. 15, 2019, by Bhushan et al.
U.S. Appl. No. 16/807,388, filed Mar. 3, 2020, by Hopkins.
U.S. Appl. No. 16/807,523, filed Mar. 3, 2020, by Hopkins.
U.S. Appl. No. 16/807,573, filed Mar. 3, 2020, by Hopkins et al.

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-35 which may be considered as a "gate-last" or "replacement-gate" process, and starting with FIGS. 1 and 2.

Figure 1:
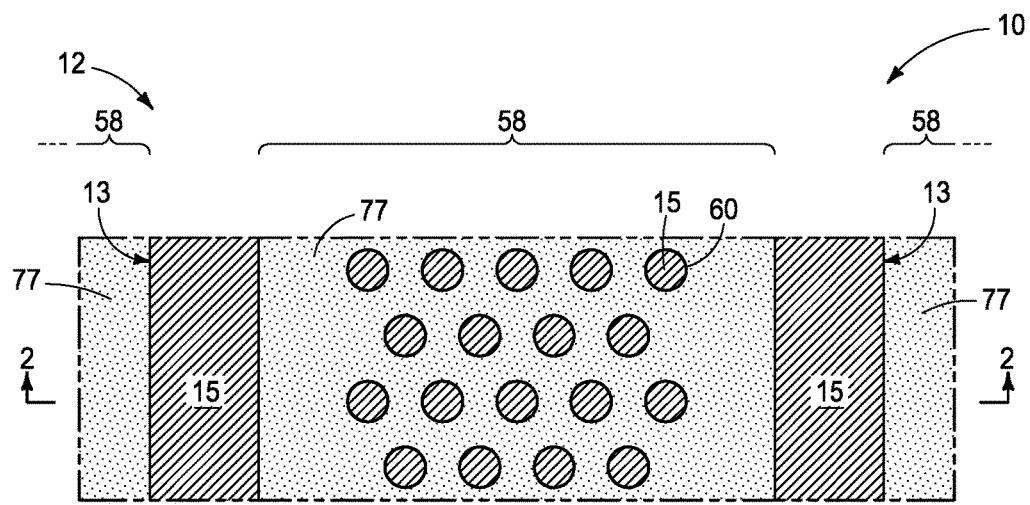
FIG. 1 is a diagrammatic cross-sectional view of a portion of a substrate in process in accordance with an embodiment of the invention and is taken through line 1-1 in FIG. 2.
Figure 2:
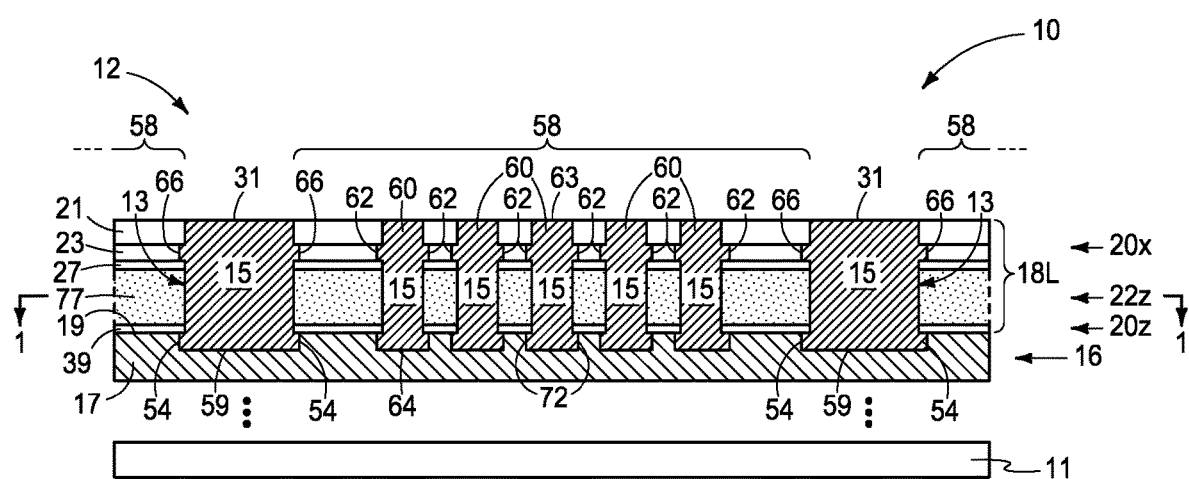
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In some embodiments and as shown, a conductor tier 16 comprising conductor material 17 (e.g., conductively-doped polysilicon atop $WSi_x$) has been formed above substrate 11. Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 when present (an * being used as a suffix to be inclusive of all such same-numerically-designated components that may or may not have other suffixes). Stack 18* will comprise vertically-alternating conductive tiers 22* and insulative tiers 20*. Example lower portion 18L is shown as comprising only two insulative tiers 20* and one conductive tier 22*. More insulative tiers 20*, more conductive tiers 22*, or less insulative tiers 20* (including zero insulative tiers 20*) may alternately be provided in lower portion 18L (not shown). Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". Example conductive tiers 22* comprise first material 26 (e.g., silicon nitride) which may be wholly or partially sacrificial. Example insulative tiers 20* comprise second material (e.g., 39, 27, 21; such as one or more insulative oxides including, for example, silicon dioxide) that is of different composition from that of first material 26 and which may be wholly or partially sacrificial. A lowest first tier 22z comprises first sacrificial material 77 (e.g., polysilicon or silicon nitride, and may be of the same or different composition from that of material of first tiers 22* there-above and/or that will be formed there-above).

Example thickness for each of tiers 20* and 22* is 20 to 60 nanometers. In one embodiment, lowest first tier 22z is thicker than the first tiers 22* there-above and/or that will be formed there-above and in one such embodiment is at least 1.5 times thicker than first tiers 22* there-above and/or that will be formed there-above. In one embodiment and as shown, lowest first tier 22z is not directly against conductor material 17 of conductor tier 16, for example where a lowest second tier 20z is vertically between conductor material 17 of conductor tier 16 and lowest first tier 22z. Alternately, the lowest first tier may be directly against the conductor material of the conductor tier (not shown). In one embodiment, lowest second tier 20z is directly against a top 19 of conductor material 17 of conductor tier 16. In one embodiment, the second tier 20x that is immediately-above lowest first tier 22z (i.e., next-higher second tier 20x) is thicker than second tiers 20* there-above and/or that will be formed there-above. A silicon nitride layer (not shown) may be between second material 39 and first sacrificial material 77, and thereby be a part of insulative tier 20z.

In one embodiment, the second-tier material of second tier 20x that is immediately-above lowest first tier 22z (i.e., there being no other second tier vertically between lowest first tier 22z and said second tier 20x immediately-there-above) comprises an upper first insulative material 21 and a lower second material 23 under upper first insulative material 21, with lower second material 23 being of different composition from that of upper first insulative material 21. In one such embodiment, lower second material 23 is thinner than upper first insulative material 21. Regardless, upper first insulative material 21 may be of the same composition as material 39. In some embodiments, the second-tier material of second tier 20x that is immediately-above lowest first tier 22z may be considered as comprising an upper insulative material 21, a lower material 27, and an intermediate material 23 vertically-between upper insulative material 21 and lower material 27, with intermediate material 23 being of different composition from that of lower material 27 and from that of upper insulative material 21 (lower material 27 being optional in some embodiments). In some such embodiments, upper insulative material 21 and lower material 27 are of the same thickness as one another. Regardless, in some embodiments upper insulative material 21 and lower material 27 are of the same composition relative one another (e.g., and the same composition as material 39) and in other embodiments are of different composition relative one another. In some embodiments, lower second material 23/intermediate material 23 comprises at least one of conductively-doped polysilicon, polysilicon that is not conductively doped, carbon-doped polysilicon, silicon nitride, undoped silicon nitride, carbon-doped silicon nitride, and metal material. One or more of materials 21, 23, or 27 may be at least partially sacrificial.

Stack 18* comprises laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Horizontally-elongated lines 13 have been formed in lowest first tier 22z (and in tiers 20*). Lines 13 are individually between immediately-laterally-adjacent memory-block regions 58. Lines 13 comprise second sacrificial material 15 of different composition from first sacrificial material 77. In one embodiment, second sacrificial material 15 comprises metal material, for example elemental tungsten above a thin layer of TiN. In some embodiments, second sacrificial material 15 is of different composition from first-tier material that is or will be formed above first sacrificial material 77 and from second-tier material that is (e.g., 27, 23, 21) or will be formed above first sacrificial material 77. In one embodiment, lines 13 individually comprise an uppermost surface 31 that is above lowest first tier 22z, and in one such embodiment that is in or at a top 33 of second tier 20x. In one embodiment, lines 13 individually comprise laterally-opposing projections 66 and/or 54 longitudinally there-along, with projections 66 being spaced below uppermost surface 31 and above lowest-line-surface 59. An oxide liner (not shown), for example formed by selective oxidation, may surround the projections and be along lowest-line-surface 59 of lines 13. In one embodiment, second sacrificial material 15 of individual lines 13 may extend laterally into respective immediately-laterally-adjacent memory-block regions 58, for example as shown occurs by example lateral projections 66 and 54. Alternately, more or all of the thickness of second sacrificial material 15 of lines 13 may extend laterally into respective immediately-laterally-adjacent memory-block regions 58 (not shown). Regardless, lines 13 may taper laterally-inward (not shown) moving deeper into lower stack portion 18L.

In one embodiment, pillars 60 have been formed in lower portion 18L. Pillars 60 are horizontally-located (i.e., in x, y coordinates) where individual channel-material strings will be formed. By way of example and for brevity only, pillars 60 are shown as being arranged in groups or columns of staggered rows of four and five pillars 60 per row. In one embodiment, pillars 60 comprise second sacrificial material 15. In one embodiment, pillars 60 individually comprise radial projections 62 that are spaced below uppermost pillar surfaces 63 and above lowest pillar surfaces 64. Pillars 60 may have additional radial projections, for example radial projections 72. An oxide liner (not shown), for example formed by selective oxidation, may surround the projections and be along lowest pillar surface 64. Pillars 60 may taper radially-inward (not shown) moving deeper into lower stack portion 18L. When both of pillars 60 and lines 13 are formed, such may be formed at the same time or at different times.

Figure 3:
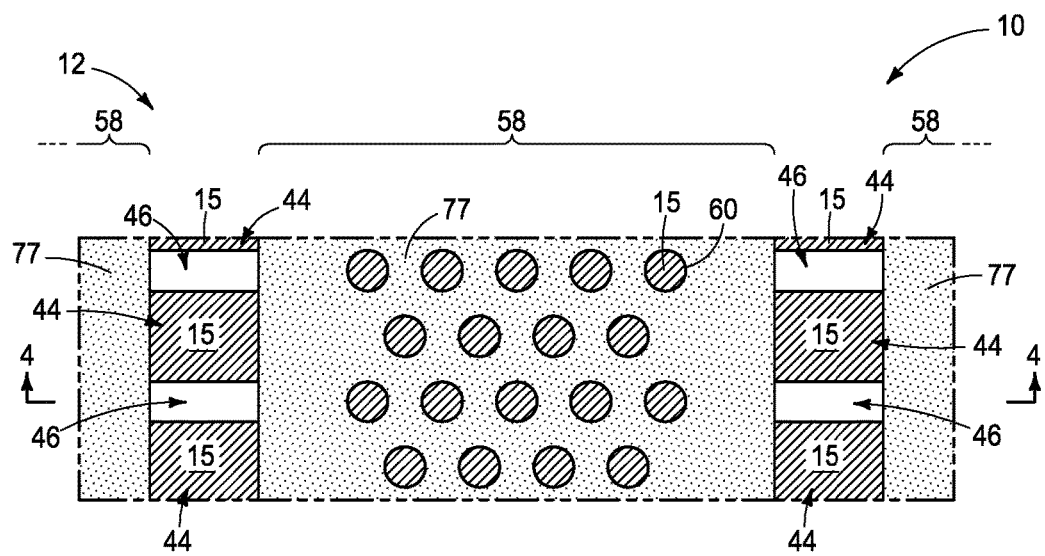
FIGS. 3-35 are diagrammatic sequential sectional, expanded, enlarged, and/or partial views of the construction of FIGS. 1 and 2, or portions thereof, in process in accordance with some embodiments of the invention.
Figure 4:
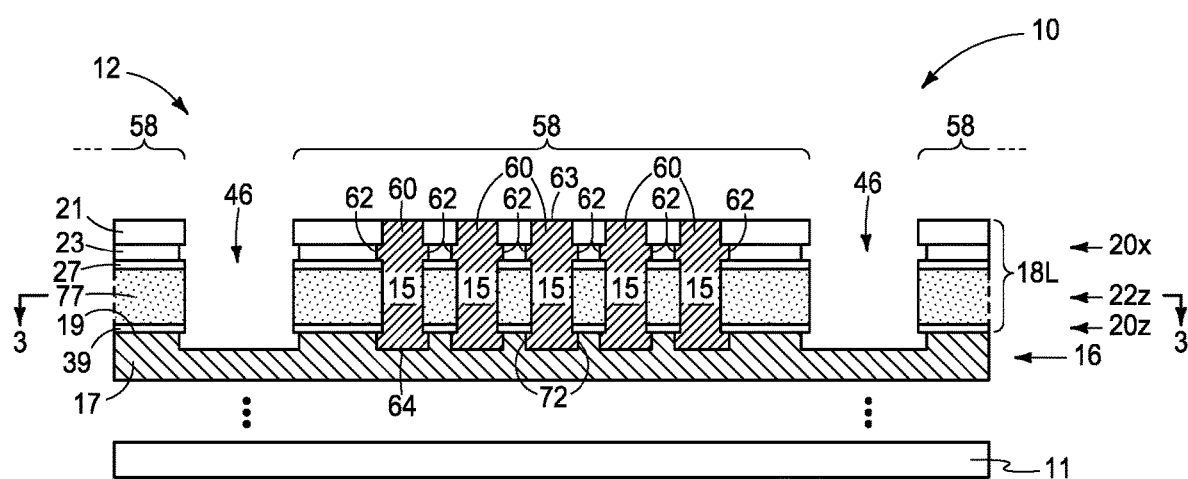

Referring to FIGS. 3 and 4, second sacrificial material 15 of lines 13 has been cut (e.g., by anisotropic etching using a photolithographically-patterned mask) to form spaced second-sacrificial-material bodies 44 (having void-spaces 46 there-between) in lowest first tier 22z longitudinally-along and between immediately-laterally-adjacent memory-block regions 58 and to first-expose first sacrificial material 77 in lowest first tier 22z longitudinally-between spaced second-sacrificial-material bodies 44. Reference to "first-expose" is temporal relative to "second-expose" referred to below and is not necessarily the first-ever exposure of the first sacrificial material, and other exposure of the first sacrificial material may occur between the "first-expose" and the "second-expose". The artisan is capable of selecting one or more suitable anisotropic etching chemistries for etching second sacrificial material 15 (e.g., using a plasma mixture of $SF_6$ and $Cl_2$ to etch tungsten).

Figure 5:
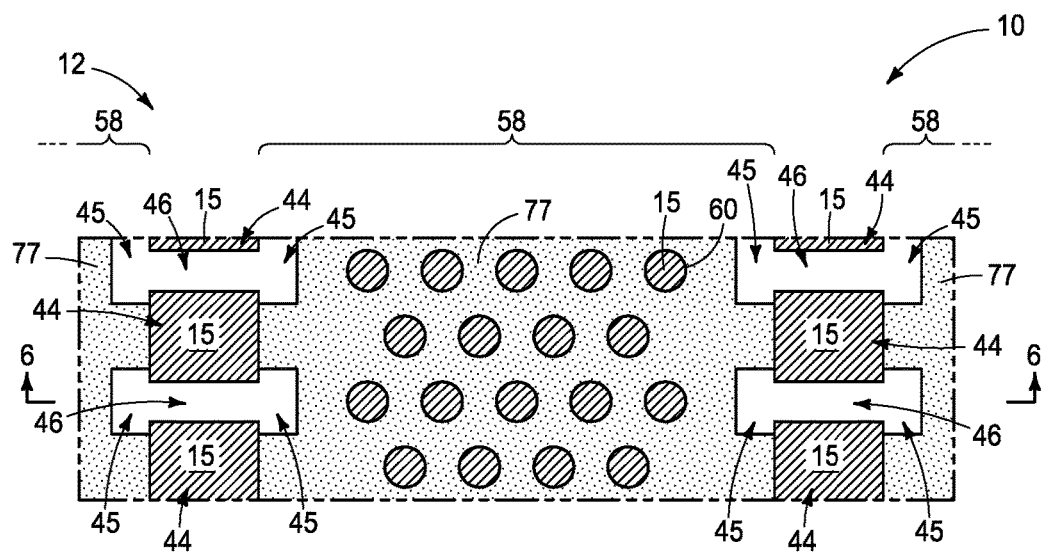
Figure 6:
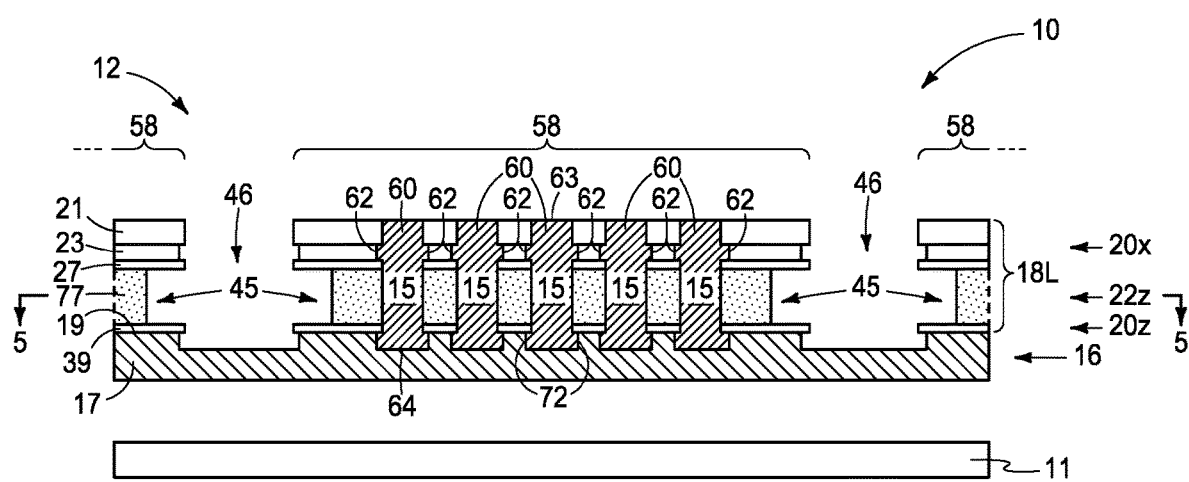

Referring to FIGS. 5 and 6, first-exposed first sacrificial material 77 has been first isotropically etched (e.g., a timed etch) from lowest first tier 22z to form spaced cavities 45 in first-exposed first sacrificial material 77 in and longitudinally along immediately-laterally-adjacent memory-block regions 58 in lowest first tier 22z. Reference to "first isotropically etch" is temporal relative to "second isotropically etch" referred to below with respect to first sacrificial material 77 and is not necessarily the first-ever isotropic etch of first sacrificial material 77, and other isotropic etch of the first sacrificial material may occur between the "first isotropic etch" and the "second isotropic etch". The artisan is capable of selecting one or more suitable etching chemistries (e.g., using liquid or vapor $H_3PO_4$ as a primary etchant where material 26 is silicon nitride or using tetramethyl ammonium hydroxide [TMAH] where material 26 is poly-silicon). In one embodiment where lower material 27 is present and as shown, the etching of first sacrificial material 77 from lowest first tier 22z may be conducted selectively relative to lower material 27 in next-higher second tier 20x to leave lower material 27 under intermediate material 23 in next-higher second tier 20x above cavities 45. Additionally, in one embodiment and as shown, the etching of first sacrificial material 77 has been conducted selectively relative to material 39 of lowest second tier 20z.

Figure 7:
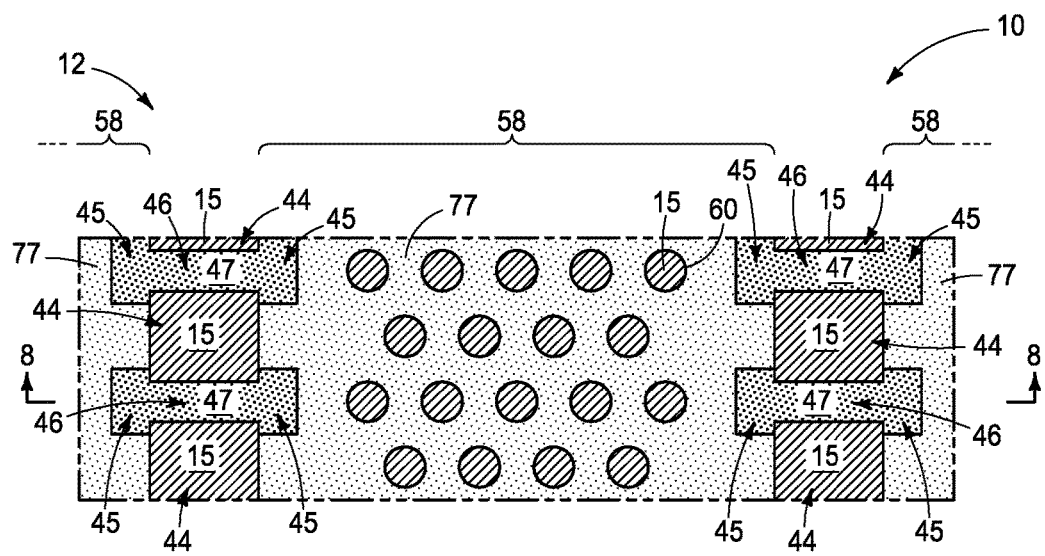
Figure 8:
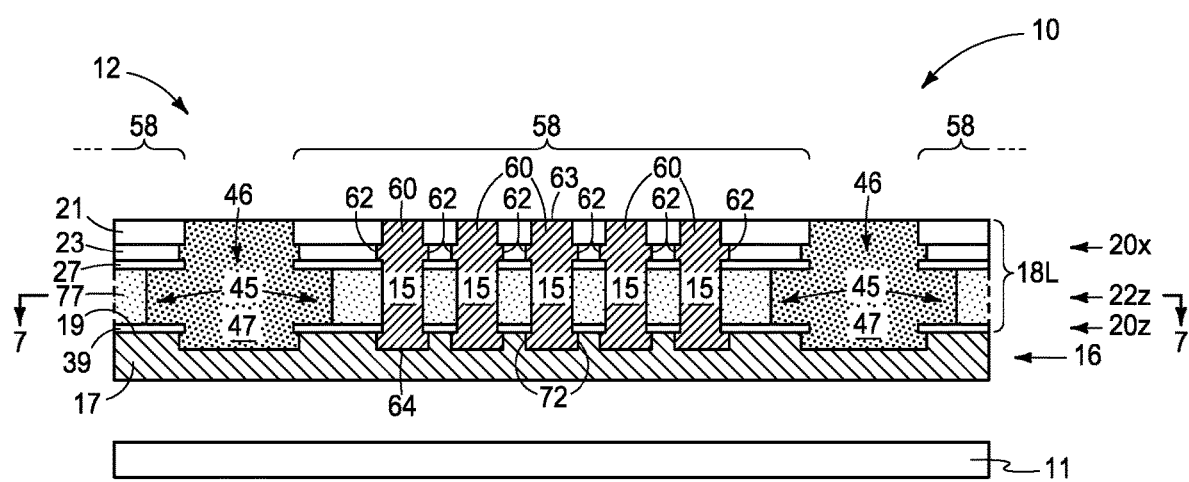

Referring to FIGS. 7 and 8, void-spaces 46 that are individually between immediately-adjacent spaced second-sacrificial-material bodies 44 and spaced cavities 45 in lowest first tier 22z have been filled with insulator material 47 (e.g., an oxide such as silicon dioxide, aluminum oxide, hafnium oxide, silicon nitride, etc.).

Figure 9:
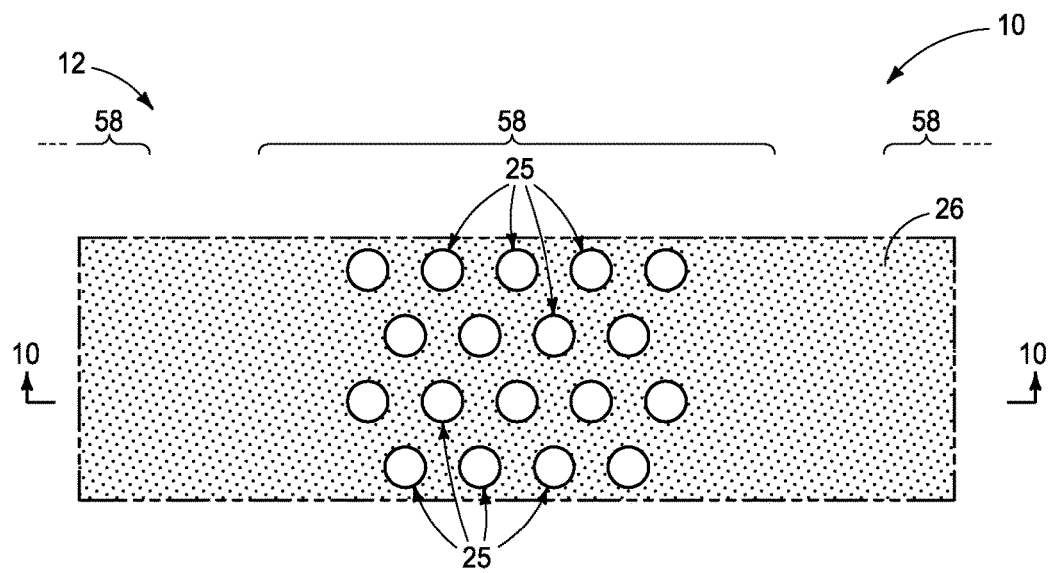
Figure 10:
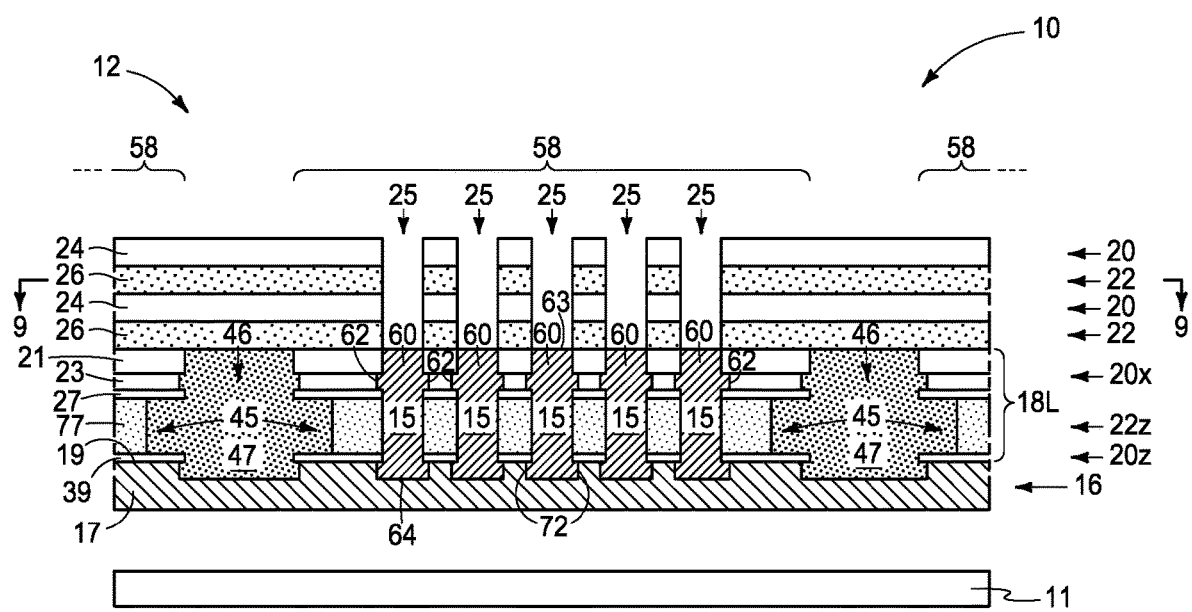

Referring to FIGS. 9 and 10, vertically-alternating first tiers 22 and second tiers 20 of an upper portion 18U of stack 18* have been formed above lower portion 18L and lines 13. Example second tiers 20 comprise second material 24 (e.g., silicon dioxide) which may be wholly or partially sacrificial. Example upper portion 18U is shown starting above lower portion 18L with a first tier 22 although such could alternately start with a second tier 20 (not shown) that would thereby be part of the immediately-lower-adjacent second tier 20*. Regardless, only a small number of tiers 20 and 22 is shown, with more likely upper portion 18U (and thereby stack 18*) comprising dozens, a hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through insulative tiers 20 and conductive tiers 22 in upper portion 18U to lower portion 18L and individually to pillars 60 when present. Alternately, channel openings 25 may extend to lowest first tier 22z (including to therein or to there-below) if pillars 60 are not present. Regardless, channel openings 25 may taper radially-inward (not shown) moving deeper into upper stack portion 18U.

Figure 11:
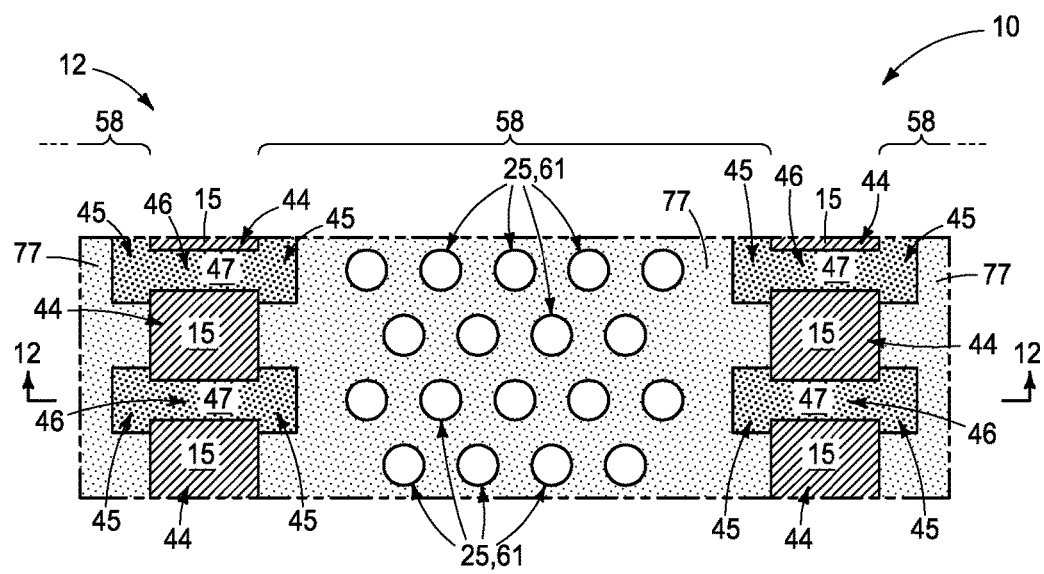
Figure 12:
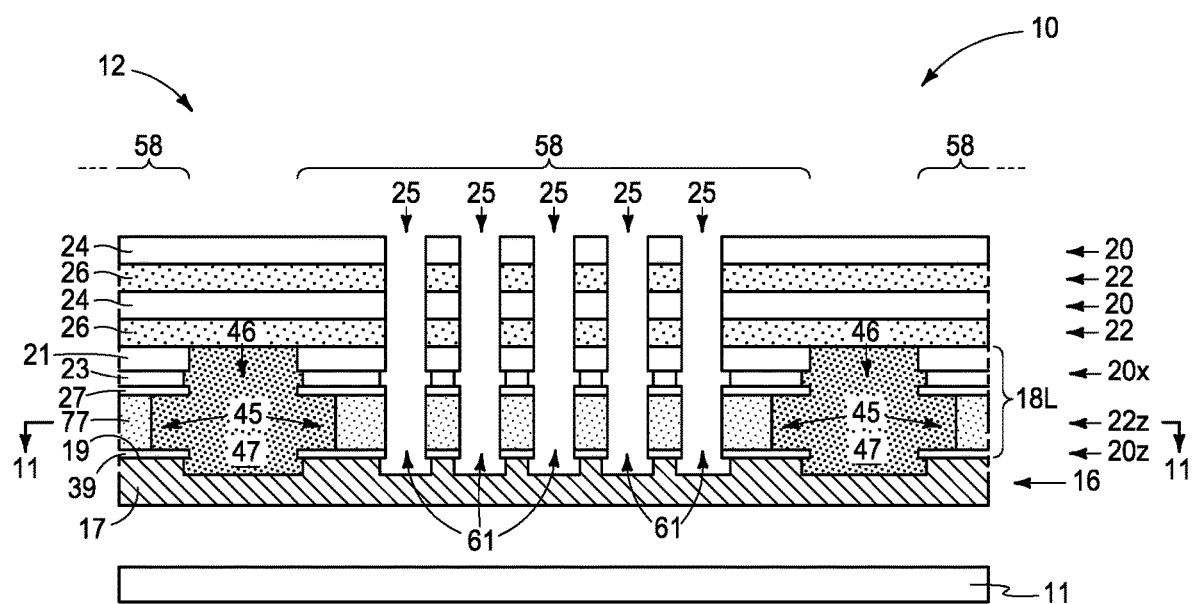
Figure 13:
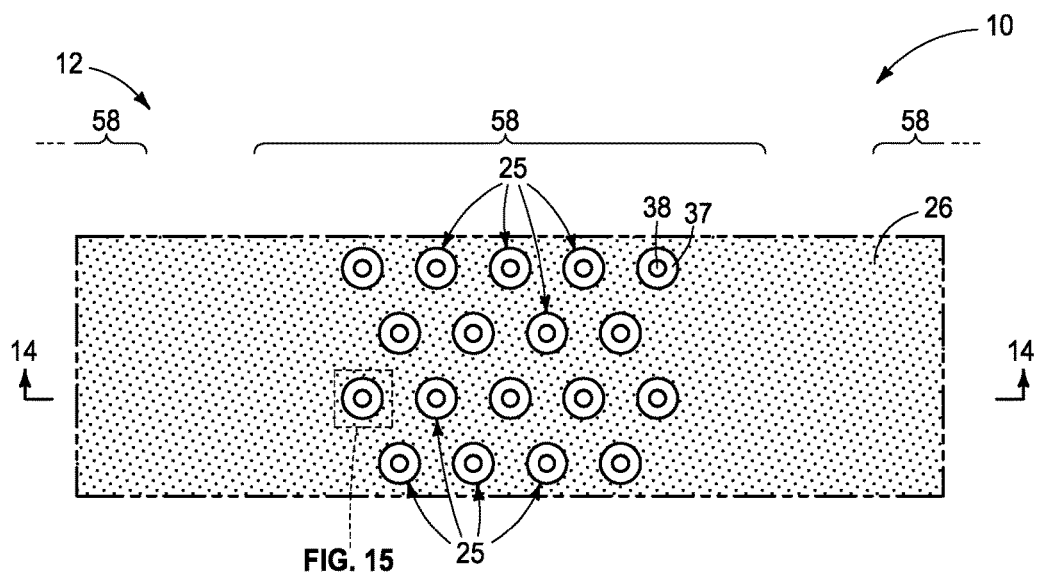
Figure 14:
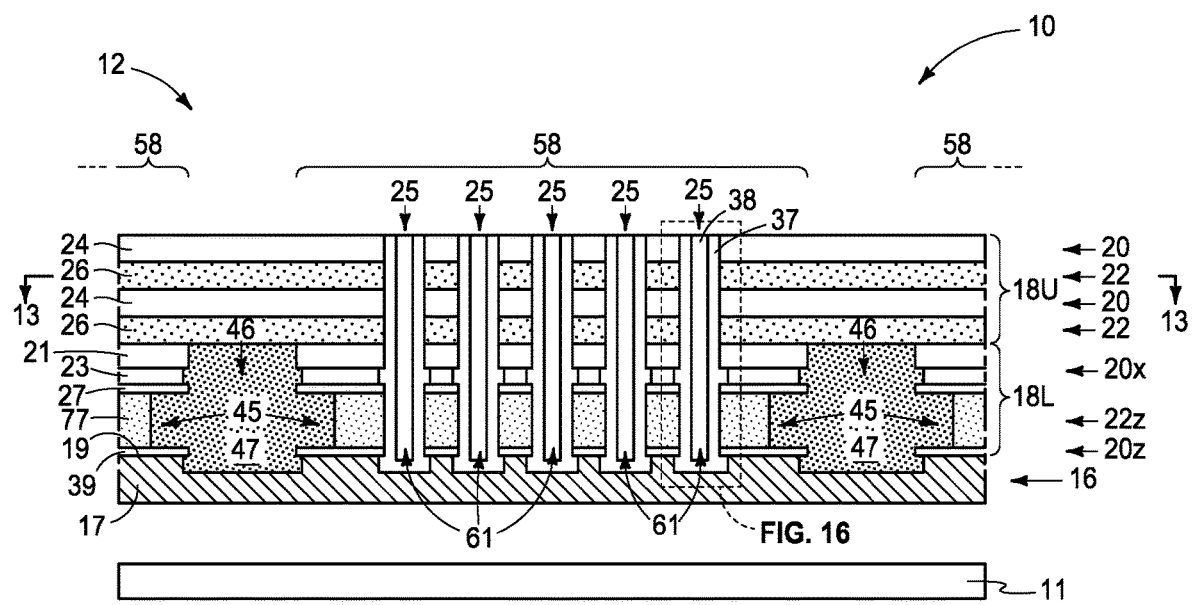

Referring to FIGS. 11 and 12, pillars 60 (not shown) have been removed (e.g., by isotropic etching) through channel openings 25 thereby effectively extending channel openings 25 into individual void-spaces 61 resulting from the removing of pillars 60 and to lowest first tier 22z. The artisan is capable of selecting a suitable isotropic etching chemistry that will etch pillar material 15 selectively relative to other exposed materials. As an example, a W material 15 can be isotropically etched selectively relative to $SiO_2$ and $Si_3N_4$ using a mixture of ammonia and hydrogen peroxide or a mixture of sulfuric acid and hydrogen peroxide.

Figure 15:
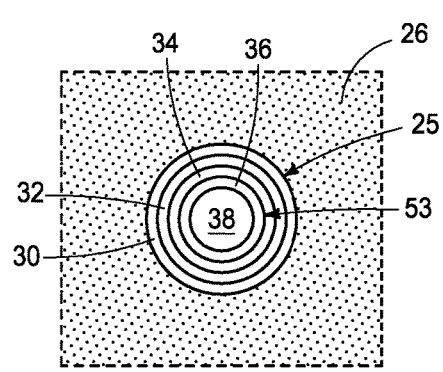
Figure 16:
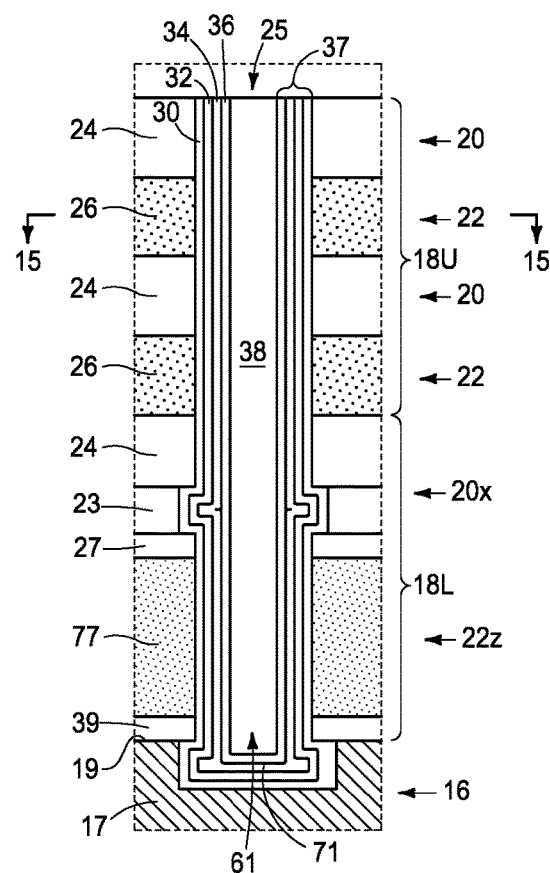

Referring to FIGS. 13-16, transistor channel material 36 has been formed in individual channel openings 25 and void-spaces 61 elevationally along the first tiers and the second tiers, thus comprising individual channel-material strings 53 that extend through first tiers 22* and second tiers 20* in upper portion 18U to lowest first tier 22z in lower portion 18L. Channel material 36 in channel-material strings 53 will be directly electrically coupled with conductive material 17 in conductor tier 16. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material. FIGS. 15 and 16 show one embodiment wherein charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 may be considered as having a lowest surface 71 thereof. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 13 and 14 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 17:
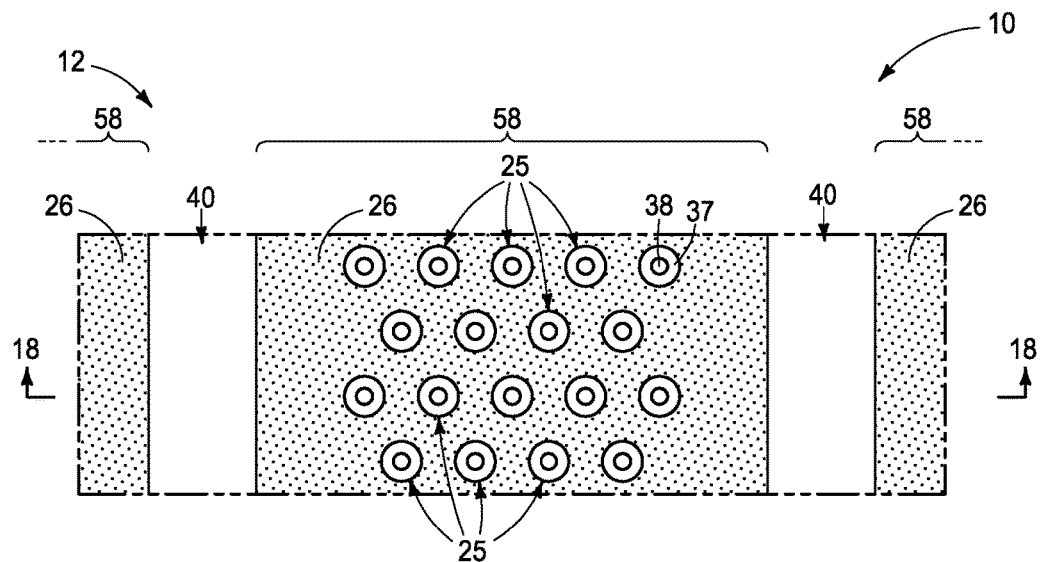
Figure 18:
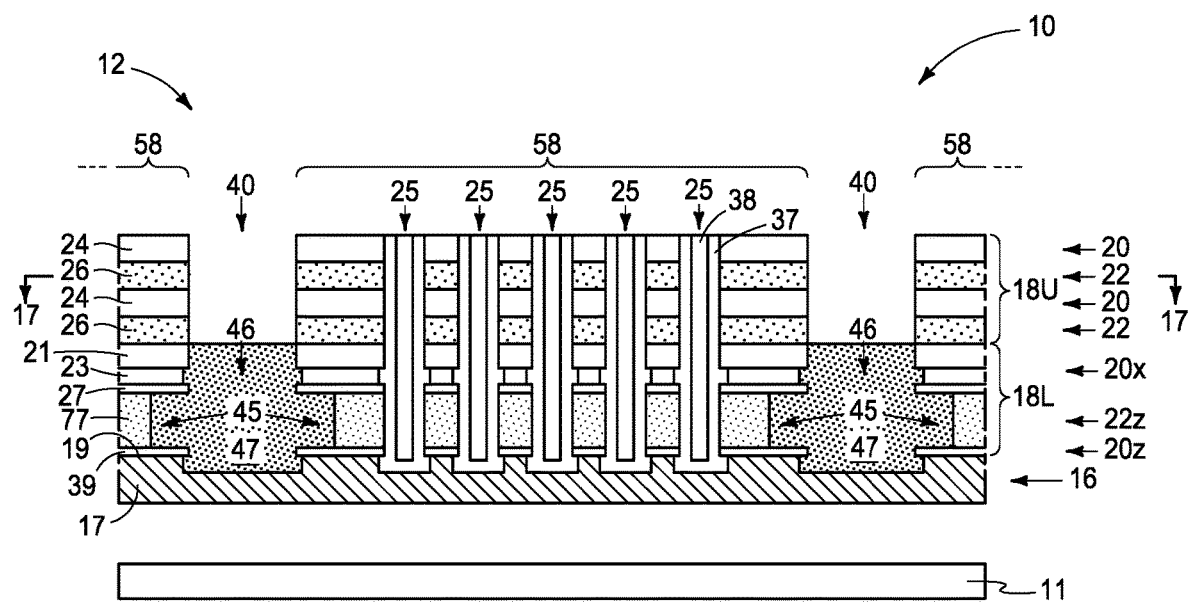

Referring to FIGS. 17 and 18, horizontally-elongated trenches 40 have been formed into stack 18* (e.g., by anisotropic etching) and are individually between immediately-laterally-adjacent memory-block regions 58 and extend to spaced second-sacrificial-material bodies 44 and insulator material 47 there-between.

Figure 19:
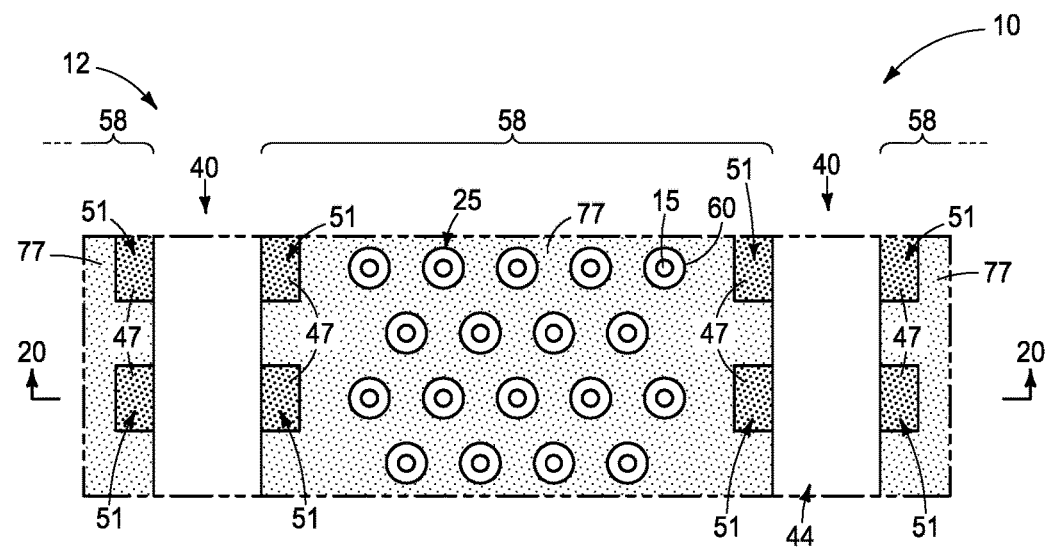
Figure 20:
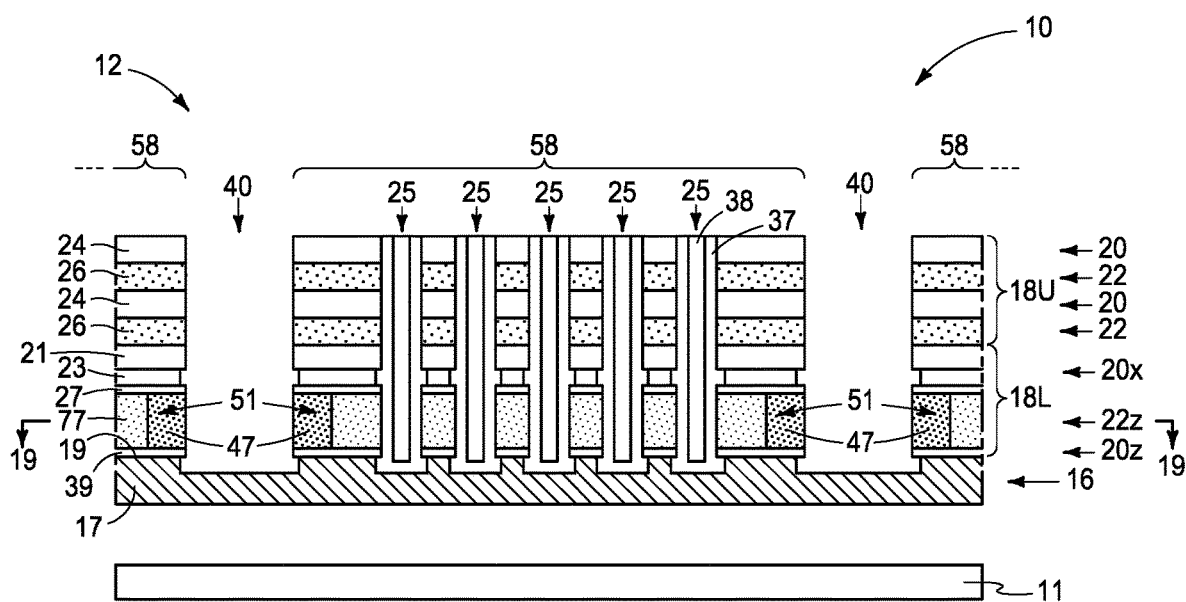

Referring to FIGS. 19 and 20, second-sacrificial-material bodies 44 (not shown) have been removed (e.g., by isotropic etching using a mixture of ammonia and hydrogen peroxide or a mixture of sulfuric acid and hydrogen peroxide if material 15 comprises W) through trenches 40 thereby effectively extending trenches 40 deeper into stack 18* and second-exposing remaining first sacrificial material 77 in lowest first tier 22z. In one embodiment (as shown), insulator material 47 (not shown) that was between the second-sacrificial-material bodies has also been removed (e.g., ideally by anisotropic etching). In embodiments where insulator material 47 is removed, such may be removed before or after removing the second-sacrificial-material bodies. Regardless, spaced insulator-material bodies 51 (e.g., comprising material 47) have been formed in and longitudinally-along opposing sides of individual memory-block regions 58 in lowest first tier 22z.

Figure 21:
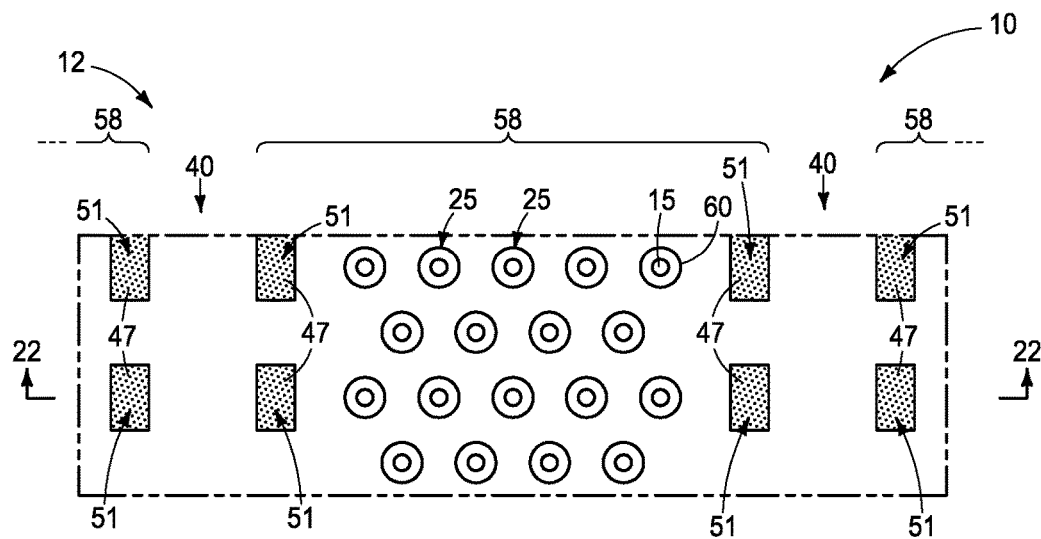
Figure 22:
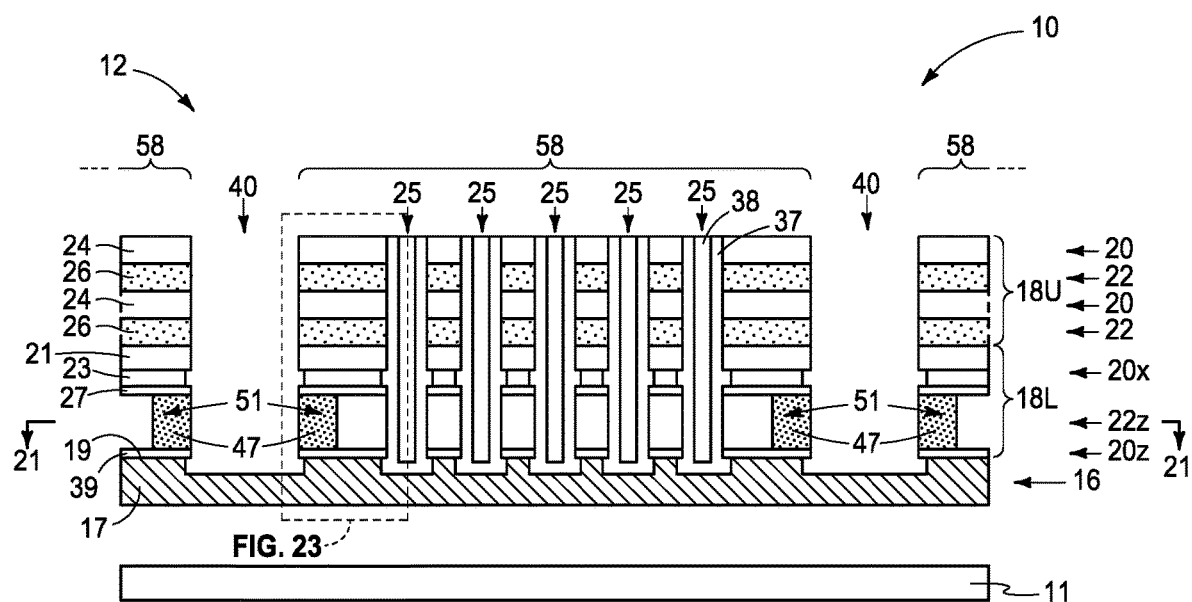
Figure 23:
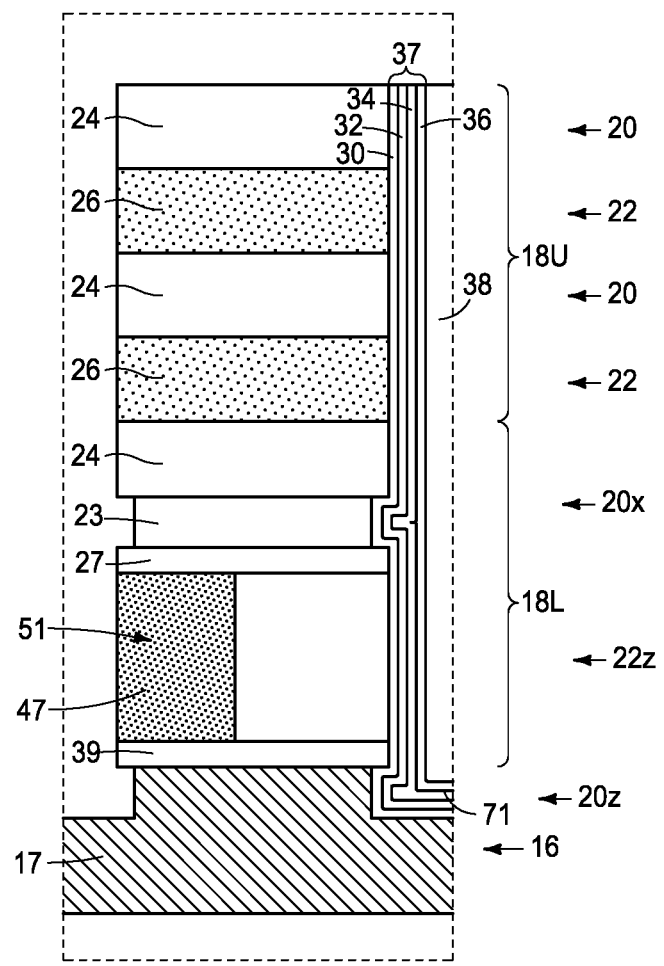

Referring to FIGS. 21-23, second-exposed remaining first sacrificial material 77 (not shown) has been second isotropically etched from lowest first tier 22z through trenches 40 (e.g., using liquid or vapor $H_3PO_4$ as a primary etchant where material 26 is silicon nitride and exposed other materials comprise one or more oxides or polysilicon or using TMAH where material 26 is polysilicon). If first-tier material 26 and first sacrificial material 77 are of the same composition, sidewalls of first-tier material 26 may be masked by a thin layer (not shown) to preclude such from being etched while etching first sacrificial material 77.

Figure 24:
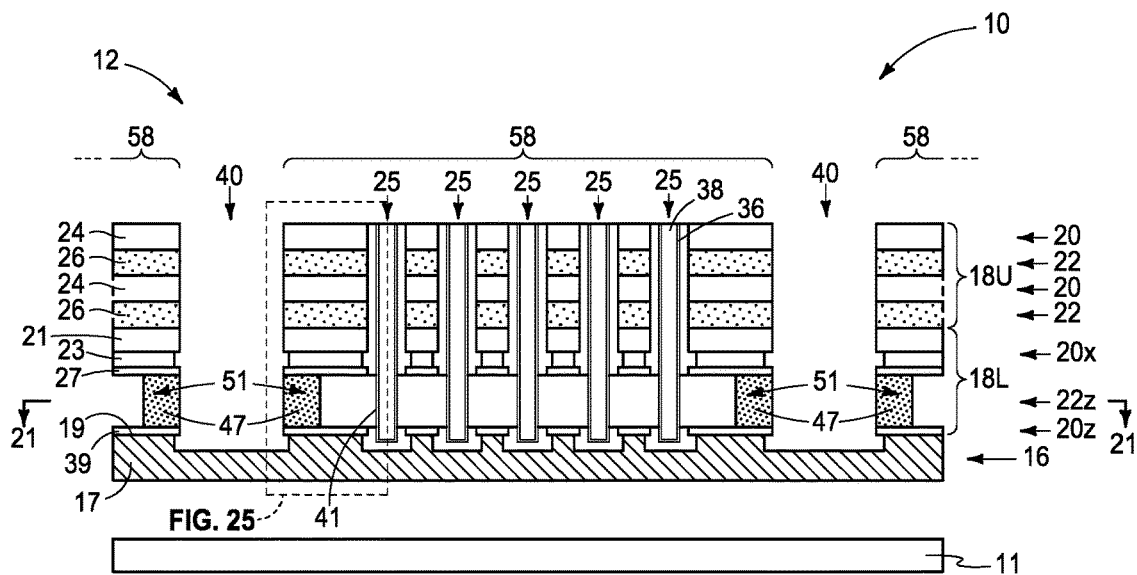
Figure 25:
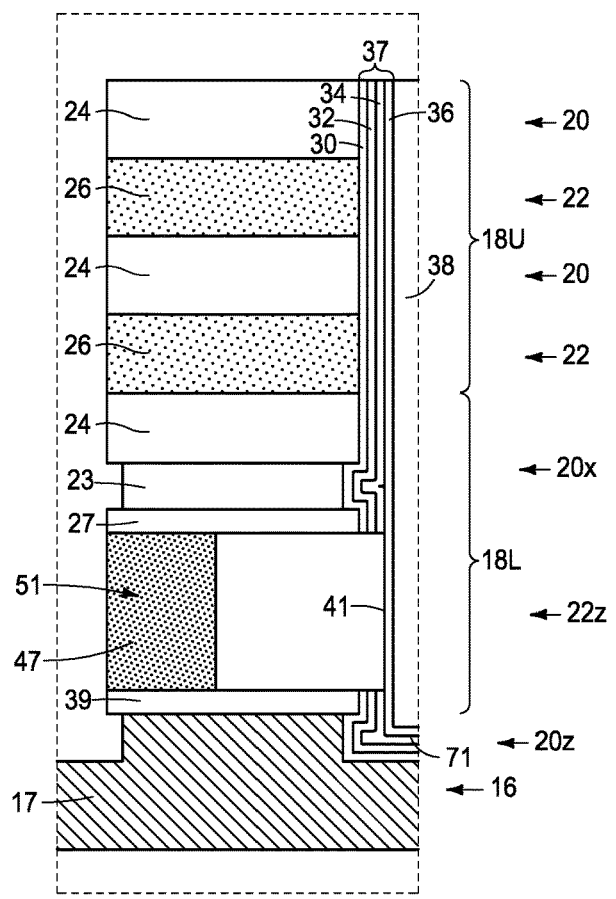

In one embodiment, a sidewall of the channel material of the channel-material strings in the lowest first tier is exposed. FIGS. 24 and 25 show example such subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 20z to expose a sidewall 41 of channel material 36 of channel-material strings 53 in lowest first tier 20z. Any of materials 30, 32, and 34 in tier 22z may be considered as being sacrificial material therein. As an example, consider an embodiment where materials 39, 27, and 21 are one or more insulative oxides (other than silicon dioxide), materials 23 and 36 are polysilicon, and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 24 and 25. The artisan is capable of selecting other chemistries for etching other different materials where a construction as shown in FIGS. 24 and 25 is desired.

Figure 26:
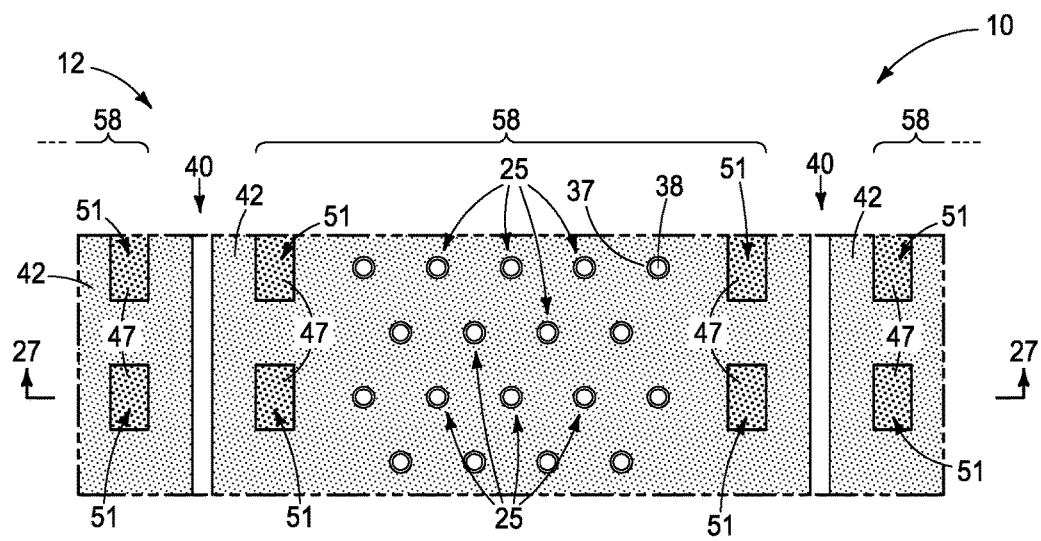
Figure 27:
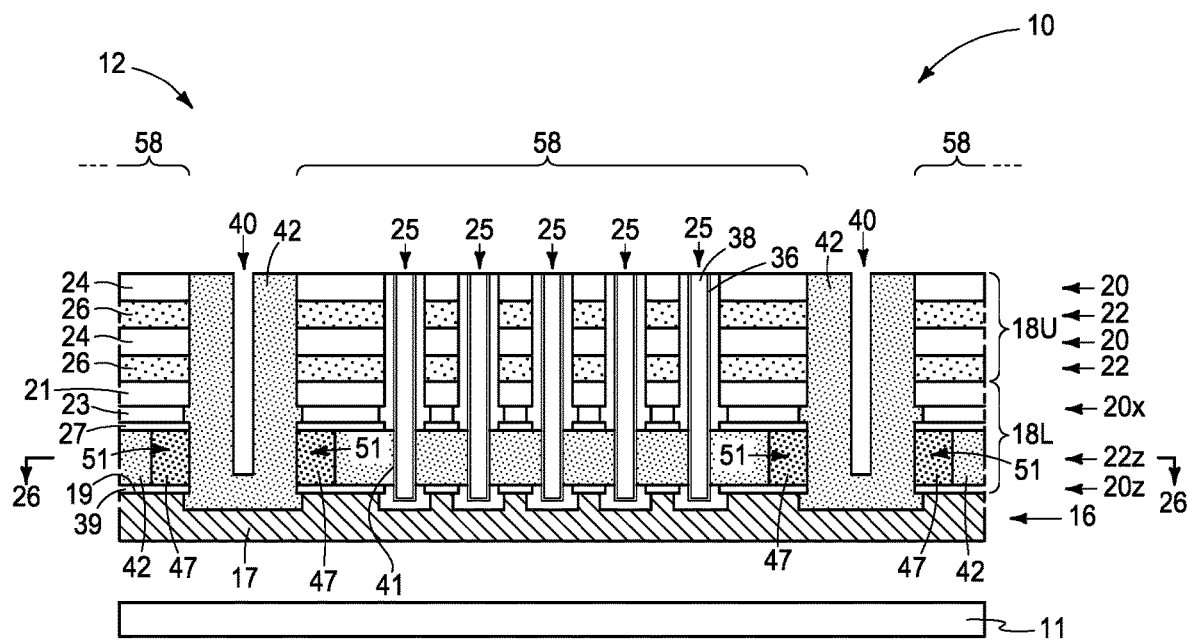

Referring to FIGS. 26 and 27, and in one embodiment, conductive material 42 has been deposited into void-space in lowest first tier 22z left as a result of removing first sacrificial material 77. In one such embodiment, conductive material 42 is directly against exposed sidewall 41 of the channel material 36 of channel-material strings 53 in lowest first tier 22z and in one embodiment is directly against an uppermost surface 19 of conductor material 17 of conductor tier 16. Such is but one example whereby conductive material 42 has been deposited to directly electrically couple together channel material 36 of individual channel-material strings 53 and conductor material 17 of conductor tier 16 (e.g., through channel-material sidewall 41). Example conductive materials 42 are conductively-doped semiconductor material (e.g., conductively-doped polysilicon) and metal material.

Figure 28:
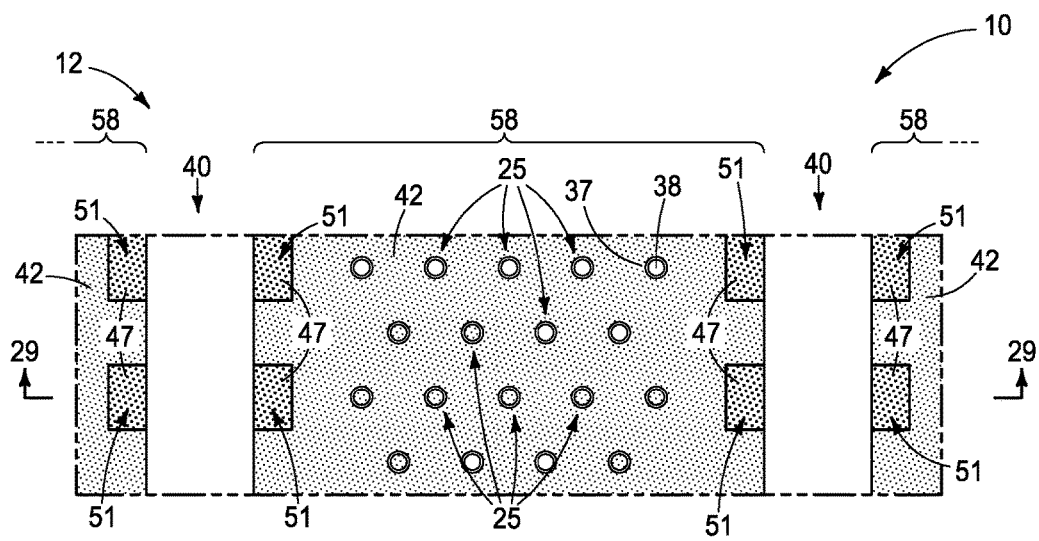
Figure 29:
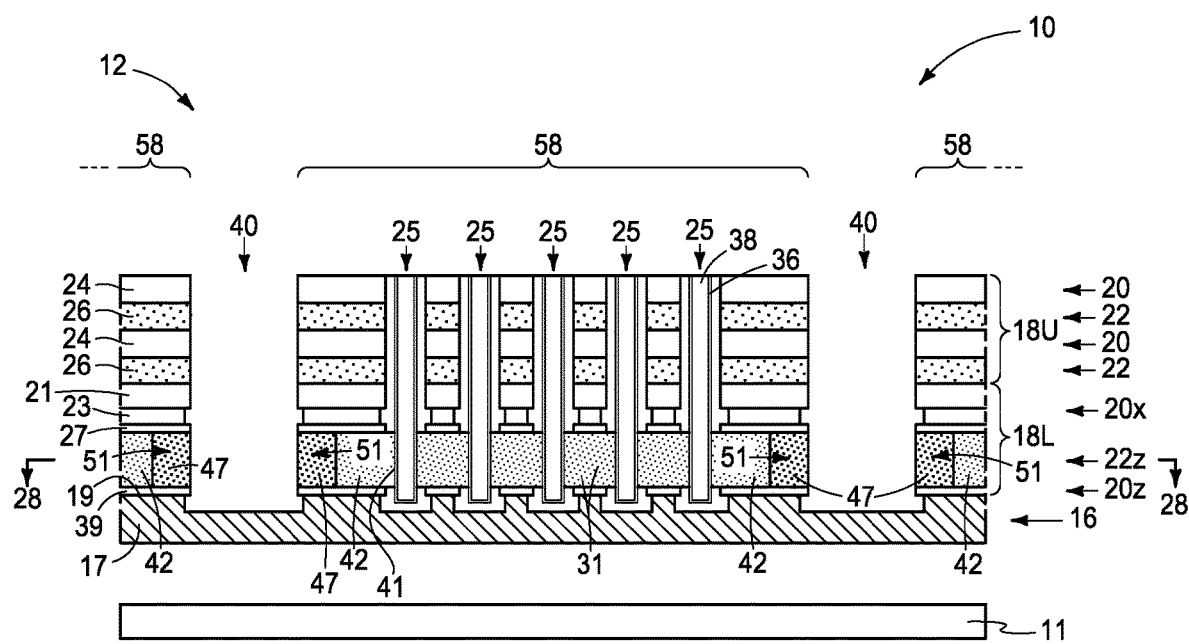
Figure 30:
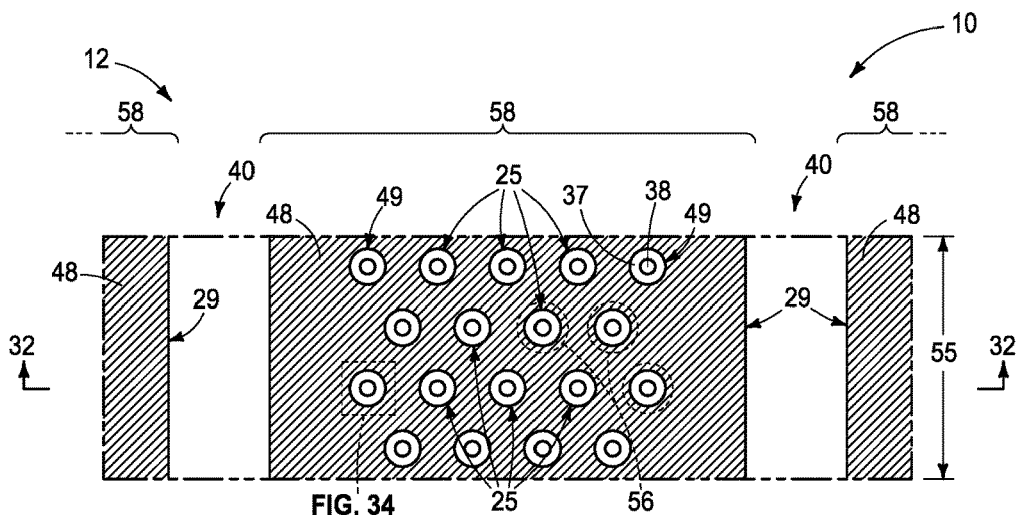
Figure 31:
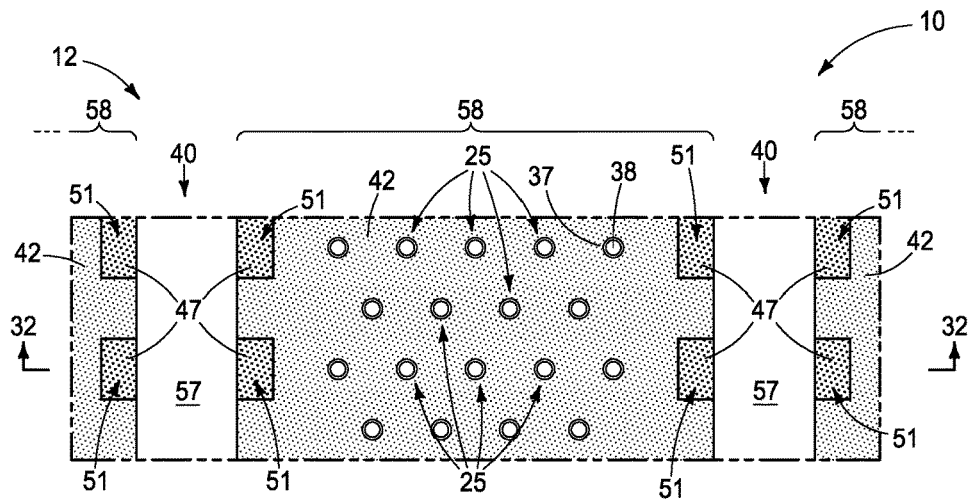
Figure 32:
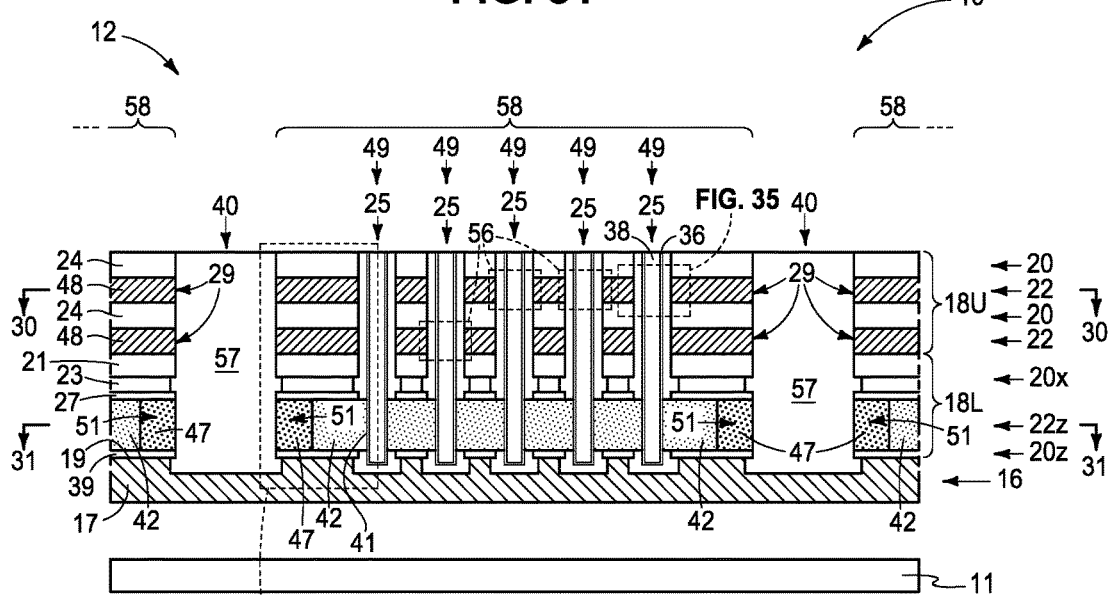
Figure 33:
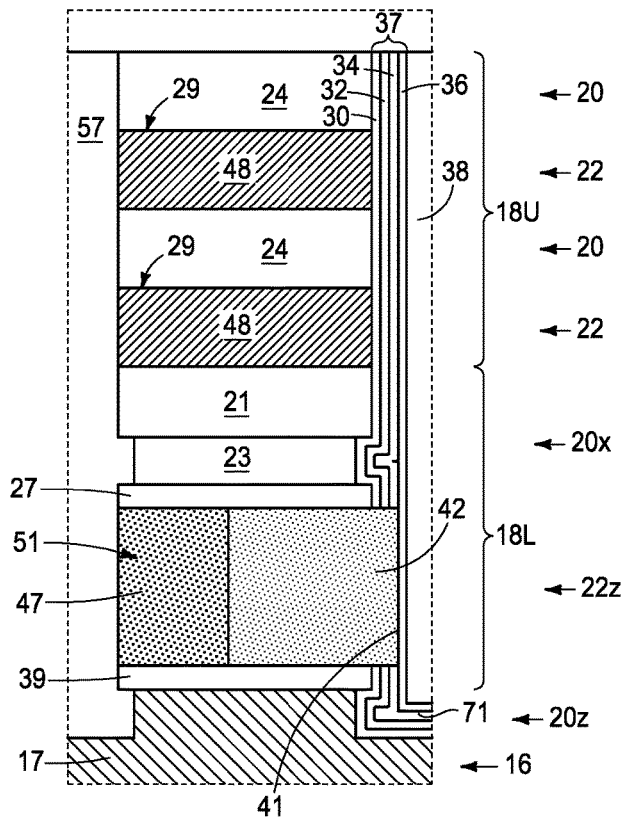
Figure 34:
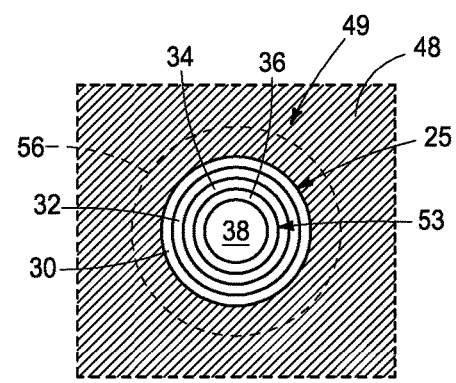
Figure 35:
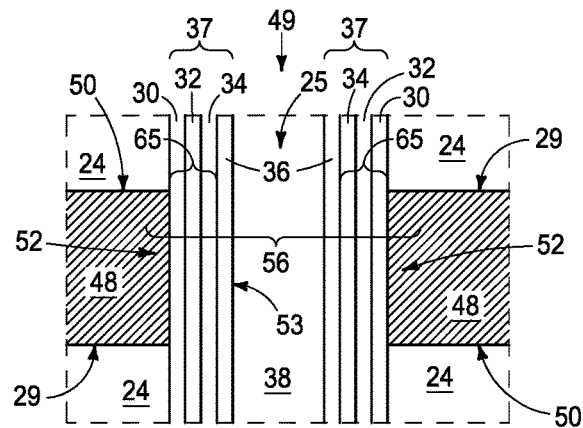

Referring to FIGS. 28 and 29, conductive material 42 has been removed from trenches 40, for example by timed isotropic or anisotropic etching that may be conducted selectively relative to materials 24, 26, 17, and 47. Such may result in some etching of conductor material 17 when exposed (not shown). Example etching chemistries where material 42 is conductively-doped polysilicon, material 24 is silicon dioxide, material 26 is silicon nitride is HBr (anisotropic) and TMAH (isotropic). Sidewalls of conductive material 42 and/or conductor material 17 may be subsequently selectively oxidized (not shown).

Referring to FIGS. 30-35, material 26 (not shown) of conductive tiers 22* has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22* in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 35 and some with dashed outlines in FIGS. 30, 32, and 34, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 35) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, lowest surface 71 of channel material 36 of channel-material strings 53 is never directly against any of conductor material 17 of conductor tier 16.

Intervening material 57 has been formed in trenches 40 and void-spaces left as a result of the removing of second sacrificial material 15 of lines 13, and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown). Some material in trenches 40 formed prior to forming that which is designated as intervening material 57 may remain and thereby comprise part of the intervening material 57.

In one embodiment, conductive material 42 is directly against insulator-material bodies 51. In one embodiment, insulator-material bodies 51 do not laterally project into space (e.g., trenches 40) between immediately-adjacent laterally-spaced memory-block regions 58. In one embodiment and as shown, conductive material 42 does not completely horizontally surround individual peripheries of insulator-material bodies 51, in one such embodiment and as shown horizontally covers a majority of such individual peripheries, and in another one such embodiment as shown horizontally covers at least 75% of the individual peripheries.

Any other attribute(s) or aspect(s) as shown and/or described herein with respect to other embodiments may be used in the embodiments shown and described with reference to the above embodiments.

Figure 36:
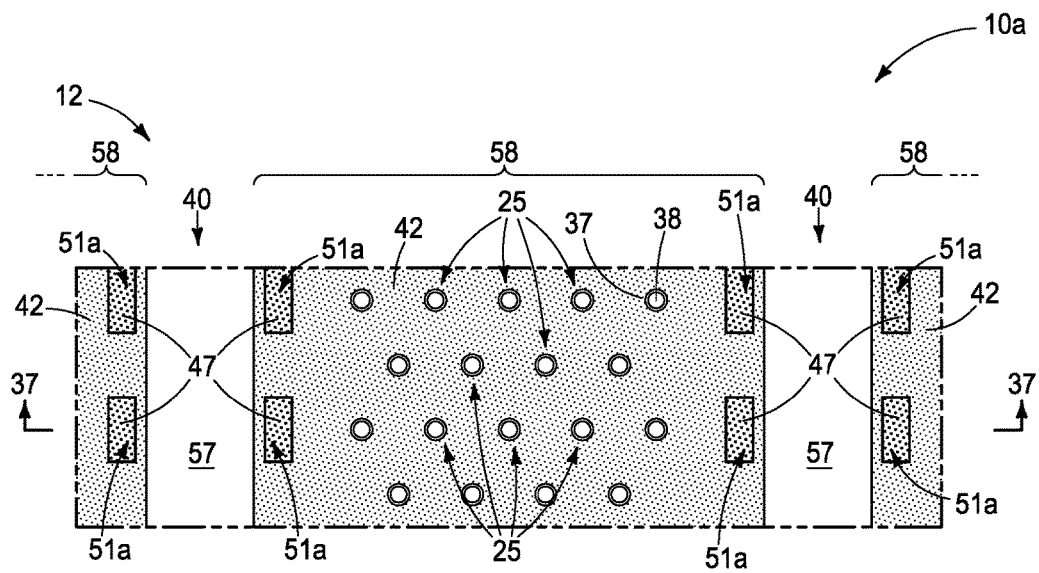
FIG. 36 is a diagrammatic cross-sectional view of a portion of a substrate in accordance with an embodiment of the invention and is taken through line 36-36 in FIG. 37.
Figure 37:
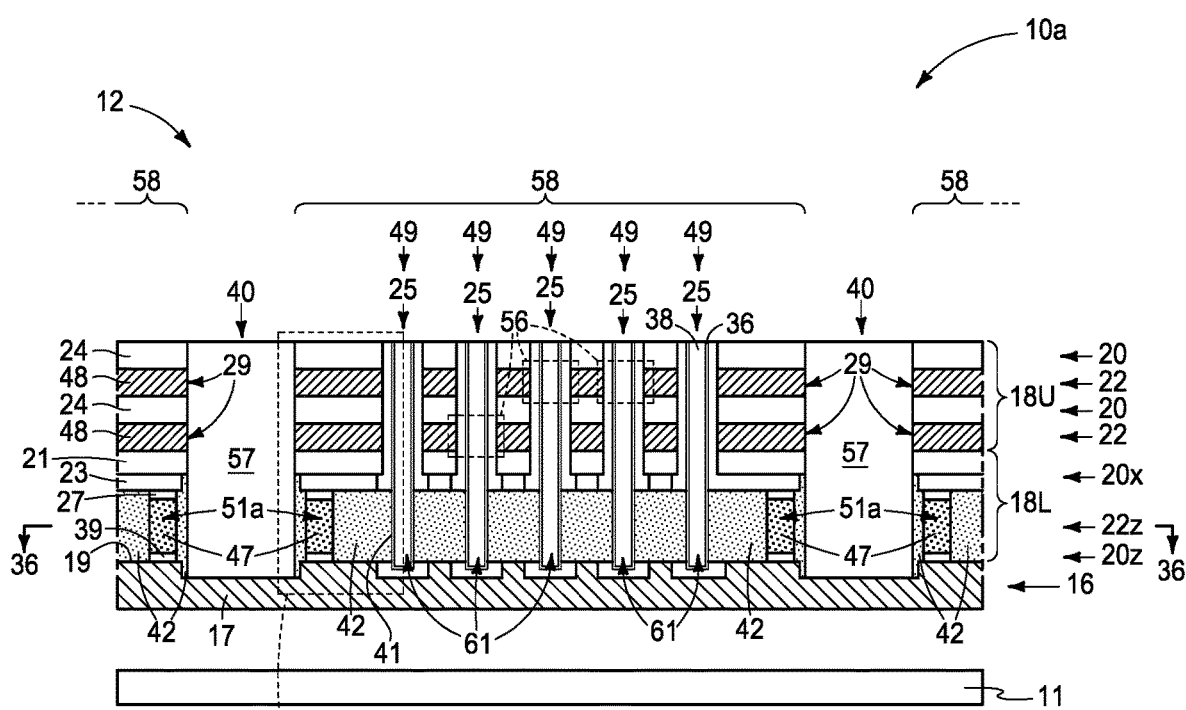
FIG. 37 is a diagrammatic cross-sectional view taken through line 37-37 in FIG. 36.
Figure 38:
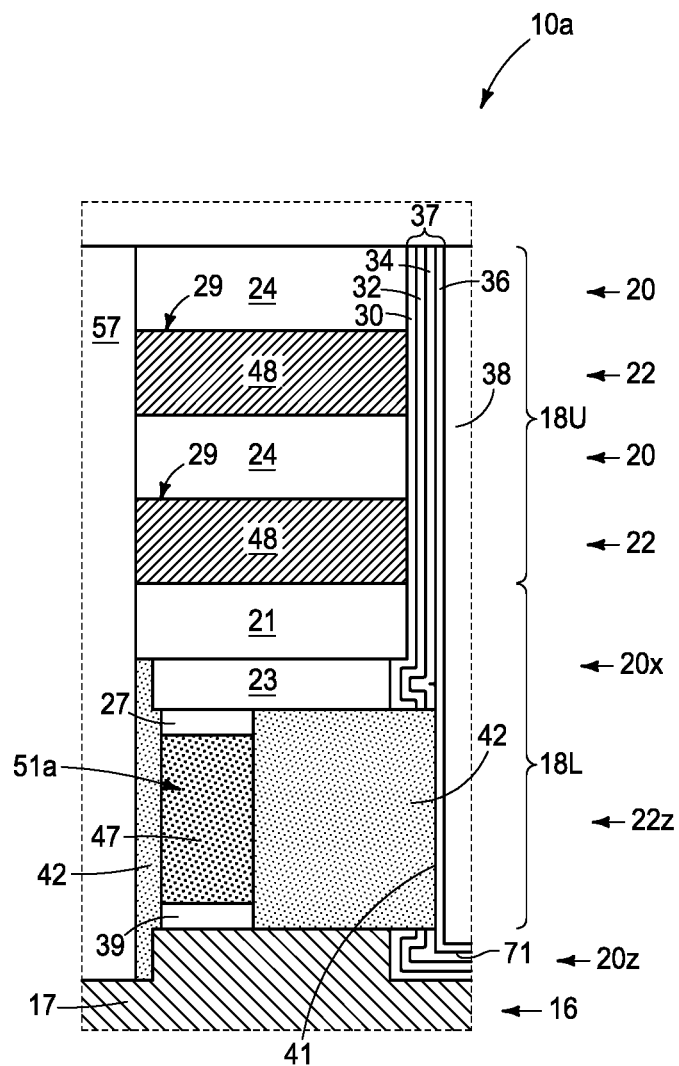
FIG. 38 is a diagrammatic enlarged view of a portion of FIG. 37.

FIGS. 36-38 show an example alternate embodiment construction 10a. Like numerals from the above-described embodiments have been used where appropriate, with some construction differences being indicated with the suffix "a" or with different numerals. FIGS. 36-38 show an example construction wherein insulator-material bodies 51a also do not laterally project into space between immediately-adjacent memory-block regions 58. Yet, and regardless, conductive material 42 in construction 10a completely horizontally surrounds individual peripheries of insulator-material bodies 51a. Such may occur where, for example, insulator-material bodies 51a after initial formation are circumferentially etched to reduce their radial expanse, thus pulling away from sides of memory block regions 58. For example, and by way of example only, where some of material 37 is silicon dioxide and insulator-material bodies 51a are also silicon dioxide, some of the etching to expose sidewalls 41 of channel material 36 as shown in FIGS. 24 and 25 may also peripherally etch insulator-material bodies 51a. Further, materials 27 and 39 may be of the same composition as insulator material 47 of insulator material bodies 51*a* and also be etched therewith, for example as shown. Any other attribute(s) or aspect(s) as shown and/or described herein with respect to other embodiments may be used.

Figure 39:
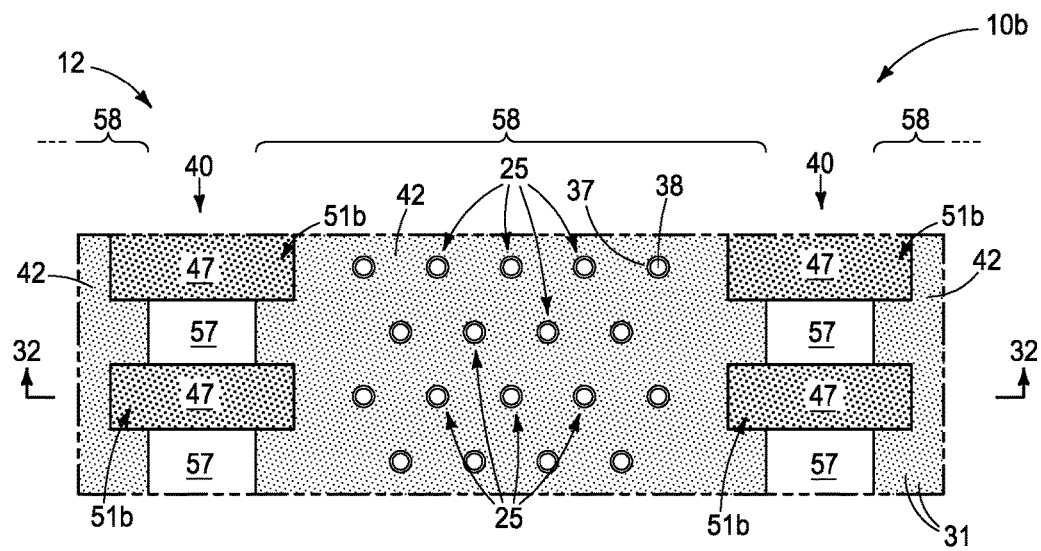
FIG. 39 is a diagrammatic cross-sectional view of a portion of a substrate in accordance with an embodiment of the invention and is taken through line 39-39 in FIG. 40.
Figure 40:
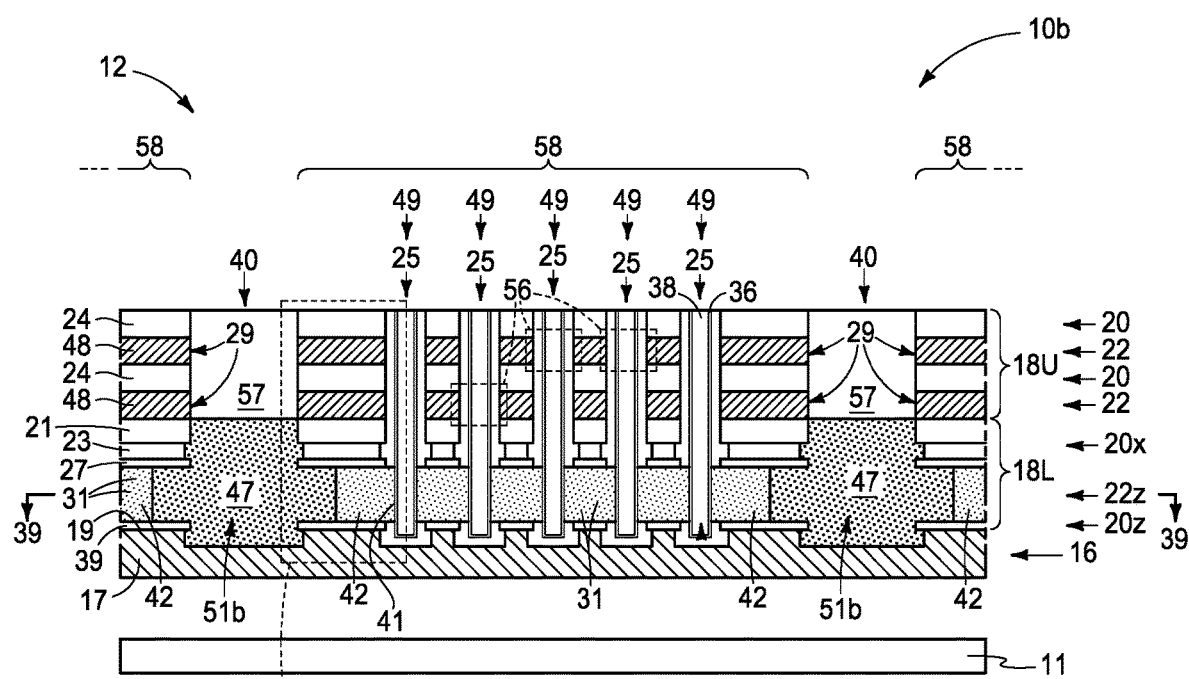
FIG. 40 is a diagrammatic cross-sectional view taken through line 40-40 in FIG. 39.

FIGS. 39 and 40 show an example alternate embodiment construction 10*b*. Like numerals from the above-described embodiments have been used where appropriate, with some construction differences being indicated with the suffix "b" or with different numerals. Construction 10*b* has insulator-material bodies 51*b* that individually span completely across space between immediately-adjacent laterally-spaced memory-block regions in a finished circuitry construction. Such may result if material 47 is not etched through in trenches 40 contrary to such being so shown in FIGS. 19 and 20. Any other attribute(s) or aspect(s) as shown and/or described herein with respect to other embodiments may be used.

In some embodiments, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). A stack (e.g., 18*) comprising vertically-alternating first tiers (e.g., 22*) and second tiers (e.g., 20*) is above the conductor tier. The stack comprises laterally-spaced memory-block regions (e.g., 58). Channel-material strings (e.g., 53) extend through the first tiers and the second tiers. Material of the first tiers is of different composition from material of the second tiers. Spaced insulator-material bodies (e.g., 51, 51*a*, 51*b*) are in and longitudinally-along opposing sides of individual of the memory-block regions in a lowest of the first tiers (e.g., 22*z*). After forming the spaced insulator-material bodies, conductive material (e.g., 42) is formed in the lowest first tier that directly electrically couples together the channel material of individual of the channel-material strings and the conductor material of the conductor tier. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a conductor tier (e.g., 16) comprising conductor material (e.g., 17). The memory array comprises laterally-spaced memory blocks (e.g., 58) individually comprising a vertical stack (e.g., 18*) comprising alternating insulative tiers (e.g., 20*) and conductive tiers (e.g., 22*) directly above the conductor tier. Channel-material strings (e.g., 53) of memory cells (e.g., 56) extend through the insulative tiers and the conductive tiers. Spaced insulator-material bodies (e.g., 51, 51*a*, 51*b*) are in and longitudinally-along opposing sides of individual of the memory blocks in a lowest of the first tiers (e.g., 22*z*). Conductive material (e.g., 42) is in the lowest first tier and directly electrically couples together the channel material of individual of the channel-material strings and the conductor material of the conductor tier. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 100 of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. A stack comprising vertically-alternating first tiers and second tiers is formed above the conductor tier. The stack comprises laterally-spaced memory-block regions. Channel-material strings extend through the first tiers and the second tiers. Material of the first tiers is of different composition from material of the second tiers. Spaced insulator-material bodies are formed in and longitudinally-along opposing sides of individual of the memory-block regions in a lowest of the first tiers. After forming the spaced insulator-material bodies, conductive material is formed in the lowest first tier that directly electrically couples together the channel material of individual of the channel-material strings and the conductor material of the conductor tier.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises first sacrificial material. Horizontally-elongated lines are formed in the lowest first tier that are individually between immediately-laterally-adjacent of the memory-block regions. The lines comprise second sacrificial material of different composition from the first sacrificial material, from the first-tier material that is or will be formed above the first sacrificial material, and from the second-tier material that is or will be formed above the first sacrificial material. The second sacrificial material of the lines is cut to form spaced second-sacrificial-material bodies in the lowest first tier longitudinally-along and between the immediately-laterally-adjacent memory-block regions and to first-expose the first sacrificial material in the lowest first tier longitudinally-between the spaced second-sacrificial-material bodies. The first-exposed first sacrificial material is first isotropically etched from the lowest first tier to form spaced cavities in the first-exposed first sacrificial material in and longitudinally-along the immediately-laterally-adjacent memory-block regions in the lowest first tier. The spaced cavities and void-spaces that are individually between immediately-adjacent of the spaced second-sacrificial-material bodies are filled in the lowest first tier with insulator material. The vertically-alternating first tiers and second tiers of an upper portion of the stack are formed above the lower portion and the lines. Channel-material strings are formed that extend through the first tiers and the second tiers in the upper portion to the lowest first tier in the lower portion. Horizontally-elongated trenches are formed into the stack that are individually between the immediately-laterally-adjacent memory-block regions and extend to the spaced second-sacrificial-material bodies and the insulator material there-between. The second-sacrificial-material bodies are removed through the trenches and form spaced insulator-material bodies in and longitudinally-along opposing sides of individual of the memory-block regions in the lowest first tier and to second-expose remaining of the first sacrificial material in the lowest first tier. After forming the spaced insulator-material bodies, the second-exposed remaining first sacrificial material is second isotropically etched from the lowest first tier through the trenches. After the second isotropically etching, conductive material is formed in the lowest first tier that directly electrically couples together the channel material of individual of the channel-material strings and the conductor material of the conductor tier.

In some embodiments, a memory array comprising strings of memory cells comprises a conductor tier comprising conductor material. Laterally-spaced memory blocks individually comprise a vertical stack comprising alternating insulative tiers and conductive tiers directly above the conductor tier. Channel-material strings of memory cells extend through the insulative tiers and the conductive tiers. Spaced insulator-material bodies are in and longitudinally-along opposing sides of individual of the memory blocks in a lowest of the first tiers. Conductive material in the lowest first tier directly electrically couples together the channel material of individual of the channel-material strings and the conductor material of the conductor tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
forming a conductor tier comprising conductor material on a substrate;
forming a stack comprising vertically-alternating first tiers and second tiers above the conductor tier, the stack comprising laterally-spaced memory-block regions, channel-material strings extending through the first tiers and the second tiers, material of the first tiers being of different composition from material of the second tiers;
forming spaced insulator-material bodies in and longitudinally-along opposing sides of individual of the memory-block regions in a lowest of the first tiers; and
after forming the spaced insulator-material bodies, forming conductive material in the lowest first tier that directly electrically couples together the channel material of individual of the channel-material strings and the conductor material of the conductor tier.

2. The method of claim 1 wherein the insulator-material bodies comprise an oxide.

3. The method of claim 1 wherein the conductive material is directly against the insulator-material bodies.

4. The method of claim 1 wherein the insulator-material bodies do not laterally project into space between immediately-adjacent of the laterally-spaced memory-block regions.

5. The method of claim 4 wherein the conductive material completely horizontally surrounds individual peripheries of the insulator-material bodies.

6. The method of claim 5 wherein the conductive material is directly against the insulator-material bodies.

7. The method of claim 1 wherein the conductive material does not completely horizontally surround individual peripheries of the insulator-material bodies.

8. The method of claim 7 wherein the conductive material horizontally covers a majority of the individual peripheries.

9. The method of claim 8 wherein the conductive material horizontally covers at least 75% of the individual peripheries.

10. The method of claim 9 wherein the conductive material is directly against the insulator-material bodies.

11. The method of claim 7 wherein the insulator-material bodies individually span completely across space between immediately-adjacent of the laterally-spaced memory-block regions in a finished circuitry construction.

12. The method of claim 1 wherein the lowest first tier is thicker than the first tiers there-above.

13. The method of claim 1 wherein a lowest surface of the channel material of the channel-material strings is never directly against any of the conductor material of the conductor tier.

14. The method of claim 1 wherein the conductive material in the lowest first tier is directly against a sidewall of the channel material of the channel-material strings.

15. The method of claim 1 wherein the conductive material in the lowest first tier is directly against an uppermost surface of the conductor material of the conductor tier.

16. A method used in forming a memory array comprising strings of memory cells, comprising:
forming a conductor tier comprising conductor material on a substrate;
forming a lower portion of a stack that will comprise vertically-alternating first tiers and second tiers above the conductor tier, the stack comprising laterally-spaced memory-block regions, material of the first tiers being of different composition from material of the second tiers, a lowest of the first tiers comprising first sacrificial material;
forming horizontally-elongated lines in the lowest first tier that are individually between immediately-laterally-adjacent of the memory-block regions; the lines comprising second sacrificial material of different composition from the first sacrificial material, from the first-tier material that is or will be formed above the first sacrificial material, and from the second-tier material that is or will be formed above the first sacrificial material;
cutting the second sacrificial material of the lines to form spaced second-sacrificial-material bodies in the lowest first tier longitudinally-along and between the immediately-laterally-adjacent memory-block regions and to first-expose the first sacrificial material in the lowest first tier longitudinally-between the spaced second-sacrificial-material bodies;
first isotropically etching the first-exposed first sacrificial material from the lowest first tier to form spaced cavities in the first-exposed first sacrificial material in and longitudinally-along the immediately-laterally-adjacent memory-block regions in the lowest first tier;
filling the spaced cavities and void-spaces that are individually between immediately-adjacent of the spaced second-sacrificial-material bodies in the lowest first tier with insulator material;
forming the vertically-alternating first tiers and second tiers of an upper portion of the stack above the lower portion and the lines, and forming channel-material strings that extend through the first tiers and the second tiers in the upper portion to the lowest first tier in the lower portion;
forming horizontally-elongated trenches into the stack that are individually between the immediately-laterally-adjacent memory-block regions and extend to the spaced second-sacrificial-material bodies and the insulator material there-between;
removing the second-sacrificial-material bodies through the trenches and forming spaced insulator-material bodies in and longitudinally-along opposing sides of individual of the memory-block regions in the lowest first tier and to second-expose remaining of the first sacrificial material in the lowest first tier;
after forming the spaced insulator-material bodies, second isotropically etching the second-exposed remaining first sacrificial material from the lowest first tier through the trenches; and
after the second isotropically etching, forming conductive material in the lowest first tier that directly electrically couples together the channel material of individual of the channel-material strings and the conductor material of the conductor tier.

17. The method of claim 16 wherein the lines individually comprise an uppermost surface that is above the lowest first tier.

18. The method of claim 17 wherein the uppermost surface is in or at a top of the second tier that is immediately-above the lowest first tier.

19. The method of claim 16 wherein the lines individually comprise laterally-opposing projections longitudinally there-along.

20. The method of claim 19 wherein the laterally-opposing projections are spaced below uppermost surfaces of the lines.

21. The method of claim 19 wherein the laterally-opposing projections are spaced above lowest surfaces of the lines.

22. The method of claim 19 wherein the laterally-opposing projections are spaced below uppermost surfaces of the lines and are spaced above lowest surfaces of the lines.

23. The method of claim 16 wherein the second sacrificial material comprises metal material.

24. The method of claim 23 wherein the metal material comprises elemental tungsten.

25. The method of claim 16 comprising removing the insulator material through the trenches prior to said second isotropically etching the second-exposed remaining first sacrificial material.

26. The method of claim 16 wherein the lowest first tier is not directly against the conductor material of the conductor tier during the first isotropically etching.

27. The method of claim 16 wherein the second-tier material of the second tier that is immediately-above the lowest first tier comprises an upper first insulative material and a lower second material under the upper first insulative material, the lower second material being of different composition from that of the upper first insulative material.

28. The method of claim 27 wherein the conductive material is directly against the lower second material in the second tier that is immediately-above the lowest first tier.

29. The method of claim 16 comprising:
forming pillars in the lower portion prior to forming the upper portion, the pillars individually being horizontally-located where individual of the channel-material strings will be formed; and
removing the pillars prior to forming the channel-material strings; and
forming the channel-material strings to individually extend into individual void-spaces resulting from the removing of the pillars.

30. The method of claim 29 wherein the pillars comprise the second sacrificial material.

31. The method of claim 29 wherein the pillars individually comprise radial projections that are spaced below uppermost surfaces of the pillars and are spaced above lowest surfaces of the pillars.

* * * * *